(12) United States Patent
Kobayashi et al.

(10) Patent No.: US 10,971,515 B2
(45) Date of Patent: Apr. 6, 2021

(54) SEMICONDUCTOR MEMORY DEVICE

(71) Applicant: TOSHIBA MEMORY CORPORATION, Minato-ku (JP)

(72) Inventors: Shigeki Kobayashi, Kuwana (JP); Masaru Kito, Kuwana (JP); Yasuhiro Uchiyama, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 43 days.

(21) Appl. No.: 16/293,954

(22) Filed: Mar. 6, 2019

(65) Prior Publication Data
US 2020/0075625 A1 Mar. 5, 2020

(30) Foreign Application Priority Data
Aug. 30, 2018 (JP) .............................. JP2018-161679

(51) Int. Cl.
*H01L 27/11582* (2017.01)
*H01L 27/1157* (2017.01)
(Continued)

(52) U.S. Cl.
CPC ...... *H01L 27/11582* (2013.01); *H01L 23/528* (2013.01); *H01L 27/1157* (2013.01);
(Continued)

(58) Field of Classification Search
CPC ........... H01L 27/11582; H01L 29/1037; H01L 27/11573; H01L 23/528; H01L 27/1157; H01L 29/40117; H01L 29/401; H01L 29/1095; H01L 29/04; H01L 29/167; H01L 29/513; H01L 29/518; H01L 29/517; H01L 23/53266; H01L 21/0217; H01L 21/02271; H01L 21/31116; H01L 21/31144;
(Continued)

(56) References Cited

U.S. PATENT DOCUMENTS 9,929,173 B2 3/2018 Kono
2012/0018796 A1* 1/2012 Yahashi ............ H01L 27/11578
257/324

(Continued)

FOREIGN PATENT DOCUMENTS

JP 2016-171243 9/2016

*Primary Examiner* — David Vu
(74) *Attorney, Agent, or Firm* — Oblon, McClelland, Maier & Neustadt, L.L.P.

(57) ABSTRACT

A semiconductor memory device includes: a first conductive layer and a first insulating layer extending in a first direction, these layers being arranged in a second direction intersecting the first direction; a first semiconductor layer opposed to the first conductive layer, and extending in a third direction intersecting the first and second directions; a second semiconductor layer opposed to the first conductive layer, extending in the third direction; a first contact electrode connected to the first semiconductor layer; and a second contact electrode connected to the second semiconductor layer. In a first cross section extending in the first and second directions, an entire outer peripheral surface of the first semiconductor layer is surrounded by the first conductive layer, and an outer peripheral surface of the second semiconductor layer is surrounded by the first conductive layer and the first insulating layer.

20 Claims, 37 Drawing Sheets

(51) Int. Cl.
  H01L 29/10      (2006.01)
  H01L 27/11573   (2017.01)
  H01L 23/528     (2006.01)
  H01L 29/40          (2006.01)
  H01L 29/04          (2006.01)
  H01L 29/167         (2006.01)
  H01L 29/51          (2006.01)
  H01L 23/532         (2006.01)
  H01L 21/02          (2006.01)
  H01L 21/311         (2006.01)
  H01L 21/3065        (2006.01)
  H01L 21/3213        (2006.01)
  H01L 21/28          (2006.01)

(52) U.S. Cl.
  CPC .... H01L 27/11573 (2013.01); H01L 29/1037 (2013.01); *H01L 21/0217* (2013.01); *H01L 21/0262* (2013.01); *H01L 21/02164* (2013.01); *H01L 21/02238* (2013.01); *H01L 21/02271* (2013.01); *H01L 21/02532* (2013.01); *H01L 21/02592* (2013.01); *H01L 21/02636* (2013.01); *H01L 21/02667* (2013.01); *H01L 21/3065* (2013.01); *H01L 21/31111* (2013.01); *H01L 21/31116* (2013.01); *H01L 21/31144* (2013.01); *H01L 21/32134* (2013.01); *H01L 23/53266* (2013.01); *H01L 29/04* (2013.01); *H01L 29/1095* (2013.01); *H01L 29/167* (2013.01); *H01L 29/401* (2013.01); *H01L 29/40117* (2019.08); *H01L 29/513* (2013.01); *H01L 29/517* (2013.01); *H01L 29/518* (2013.01)

(58) Field of Classification Search
  CPC ......... H01L 21/31111; H01L 21/02164; H01L 21/02636; H01L 21/02532; H01L 21/02592; H01L 21/0262; H01L 21/3065; H01L 21/02667; H01L 21/02238; H01L 21/32134; H01L 27/11565; H01L 27/11517; H01L 27/11521; H01L 27/11563; H01L 27/11568
  See application file for complete search history.

(56) References Cited

U.S. PATENT DOCUMENTS

| | | |
|---|---|---|
| 2016/0268304 A1 | 9/2016 | Ikeda et al. |
| 2017/0077108 A1 | 3/2017 | Kawaguchi et al. |
| 2017/0213845 A1 | 7/2017 | Baba |
| 2017/0263638 A1 | 9/2017 | Okada |
| 2018/0090507 A1 | 3/2018 | Ichinose |
| 2019/0287986 A1 | 9/2019 | Okawa et al. |

* cited by examiner

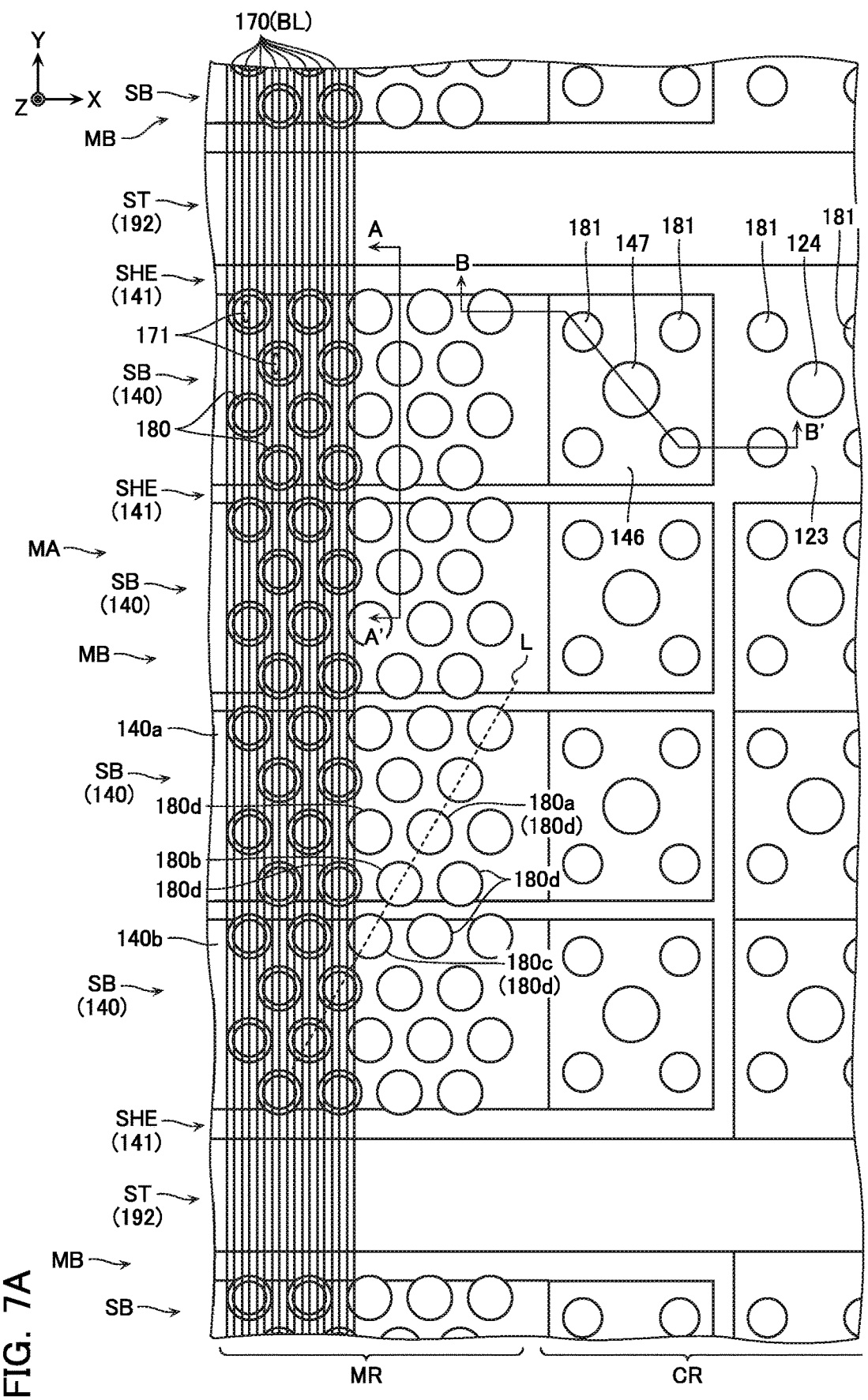

SEMICONDUCTOR MEMORY DEVICE

CROSS-REFERENCE TO RELATED APPLICATIONS

This application is based upon and claims the benefit of Japanese Patent Application No. 2018-161679, filed on Aug. 30, 2018, the entire contents of which are incorporated herein by reference.

BACKGROUND

Field

Embodiments described below relate to a semiconductor memory device.

Description of the Related Art

Semiconductor memory devices are increasingly becoming highly integrated.

BRIEF DESCRIPTION OF THE DRAWINGS

FIG. 7A is a schematic plan view of the memory cell array MA;

DETAILED DESCRIPTION

Figure 1:
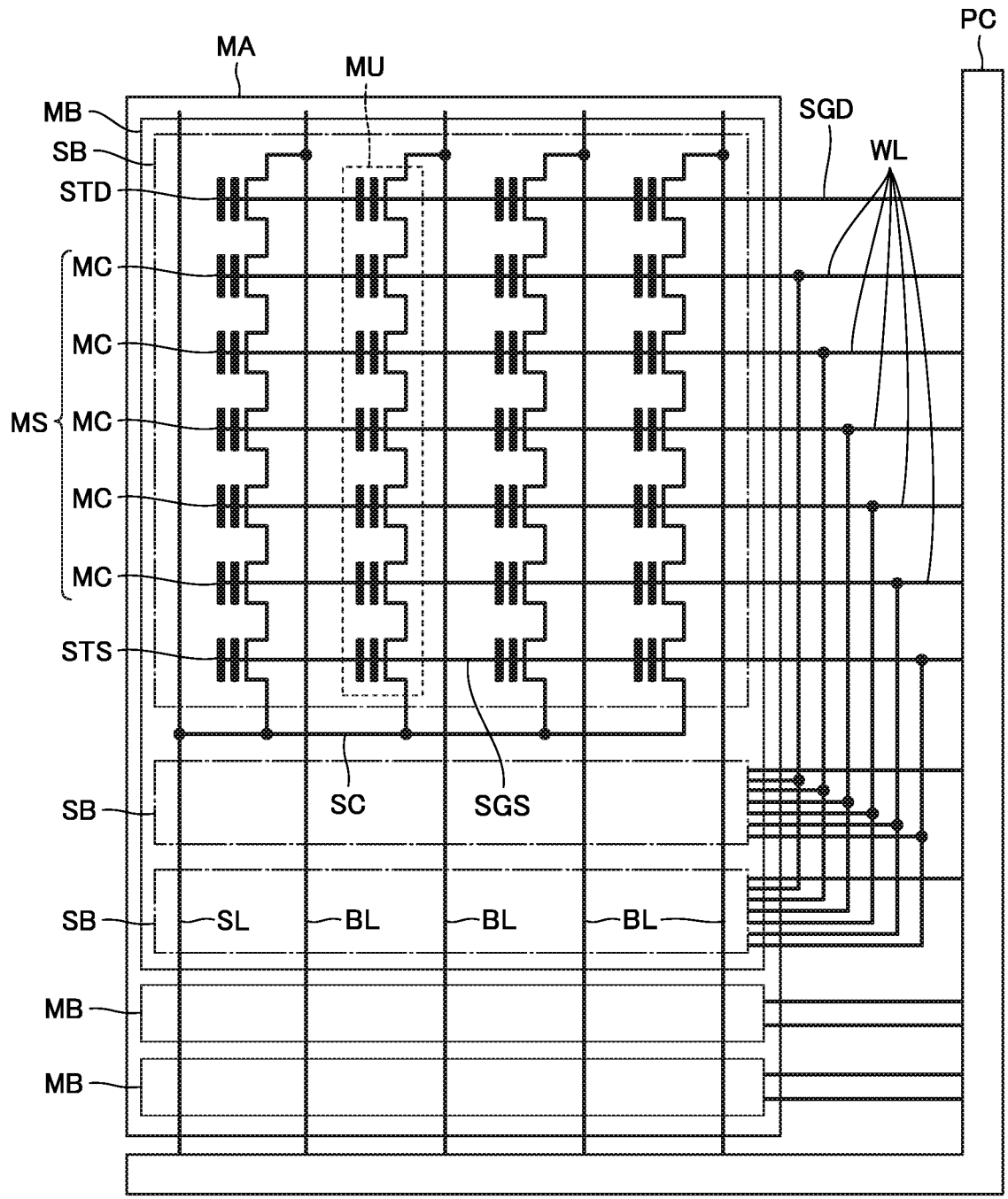
FIG. 1 is an equivalent circuit diagram illustrating the schematic configuration of a semiconductor memory device according to a first embodiment.

A semiconductor memory device according to one embodiment of the present invention includes: a first conductive layer extending in a first direction; a first insulating layer extending in the first direction, the first conductive layer and the first insulating layer being arranged in a second direction intersecting the first direction; a first semiconductor layer opposed to the first conductive layer, and extending in a third direction intersecting the first direction and the second direction; a second semiconductor layer opposed to the first conductive layer, extending in the third direction, and having a different position in the second direction from the first semiconductor layer; a first contact electrode connected to the first semiconductor layer; and a second contact electrode connected to the second semiconductor layer. Further, in a first cross section extending in the first direction and the second direction, an entire outer peripheral surface of the first semiconductor layer is surrounded by the first conductive layer, and an outer peripheral surface of the second semiconductor layer is surrounded by the first conductive layer and the first insulating layer.

A semiconductor memory device according to one embodiment of the present invention includes: a first conductive layer extending in a first direction; a second conductive layer having a different position from the first conductive layer in a second direction intersecting the first direction; a first insulating layer extending in the first direction, the second conductive layer and the first insulating layer being arranged in a third direction intersecting the first direction and the second direction; a first semiconductor layer opposed to the first conductive layer, the second conductive layer, and the first insulating layer, and extending in the second direction; and a first contact electrode connected to the first semiconductor layer. Further, in a first cross section extending in the first direction and the third direction, an entire outer peripheral surface of the first semiconductor layer is surrounded by the first conductive layer. Additionally, in a second cross section extending in the first direction and the third direction, the outer peripheral surface of the first semiconductor layer is surrounded by the second conductive layer and the first insulating layer.

A semiconductor memory device according to one embodiment of the present invention includes: a first conductive layer extending in a first direction; a second conductive layer extending in the first direction, the first conductive layer and the second conductive layer being arranged in a second direction intersecting the first direction; a first insulating layer extending in the first direction, and provided between the first conductive layer and the second conductive layer; a first semiconductor layer opposed to the first conductive layer and the first insulating layer, and extending in a third direction intersecting the first direction and the second direction; a second semiconductor layer opposed to the second conductive layer and the first insulating layer, extending in the third direction, and having a different position in the second direction from the first semiconductor layer; and a first gate insulating film provided between the first conductive layer and the first semiconductor layer and between the first insulating layer and the first semiconductor layer, and contacting the first insulating layer and an outer peripheral surface of the first semiconductor layer.

A semiconductor memory device according to one embodiment of the present invention includes: a first conductive layer extending in a first direction; a second conductive layer extending in the first direction, the first conductive layer and the second conductive layer being arranged in a second direction intersecting the first direction; a first insulating layer extending in the first direction, and provided between the first conductive layer and the second conductive layer; a first semiconductor layer opposed to the first conductive layer and the first insulating layer, and extending in a third direction intersecting the first direction and the second direction; and a second semiconductor layer opposed to the second conductive layer and the first insulating layer, and extending in the third direction. Further, in a first cross section extending in the first direction and the second direction, the first semiconductor layer and the second semiconductor layer are arranged in a fourth direction intersecting the first direction, and the first insulating layer includes: a first portion provided between the first semiconductor layer and the second semiconductor layer; and a second portion having a length in the fourth direction longer than a length in the fourth direction of the first portion.

Next, semiconductor memory devices according to embodiments are described in detail with reference to the drawings. Note that the following embodiments are merely examples, and are not described with the intention of limiting the present invention.

Further, in this specification, a certain direction is referred to as a first direction, the direction intersecting the first direction is referred to as a second direction, and a direction intersecting a plane extending in the first direction and the second direction is referred to as a third direction. Further, a predetermined direction parallel to the surface of the substrate is referred to as an X direction, the direction parallel to the surface of the substrate and perpendicular to the X direction is referred to as a Y direction, and the direction perpendicular to the surface of the substrate is referred to as a Z direction. Each of the first direction, the second direction and the third direction may correspond to any of the X direction, the Y direction, the Z direction and any other direction.

Further, in this specification, expressions such as "up", "down", and the like are based on the substrate. For example, the direction separating from the substrate along the abovementioned Z direction is referred to as up, and the direction approaching the substrate along the Z direction is referred to as down. Further, a lower surface and a lower end of a configuration mean the surface and the end portion on the substrate side of the configuration, and an upper surface and an upper end of a configuration mean the surface and the end portion on the side opposite to the substrate of the configuration. Further, the surface intersecting the X direction or the Y direction is referred to as a side surface.

First Embodiment

[Configuration]

FIG. 1 is an equivalent circuit diagram illustrating the schematic configuration of a semiconductor memory device according to a first embodiment. For convenience of description, a part of the configuration is omitted in FIG. 1.

The semiconductor memory device according to this embodiment includes a memory cell array MA, and a peripheral circuit PC that controls the memory cell array MA.

The memory cell array MA includes a plurality of memory blocks MB. Those plurality of memory blocks MB each include a plurality of subblocks SB. Those plurality of subblocks SB each include a plurality of memory units MU. One end of each of those plurality of memory units MU is connected to the peripheral circuit PC via a bit line BL. Further, another end of each of those plurality of memory units MU is connected to the peripheral circuit PC via a common lower wiring SC and a common source line SL.

The memory unit MU includes a drain select transistor STD, a memory string MS, and a source select transistor STS connected in series between the bit line BL and the lower wiring SC. The drain select transistor STD and the source select transistor STS may be hereinafter simply referred to as select transistors (STD and STS).

The memory string MS includes a plurality of memory cells MC connected in series. The memory cell MC is a field effect transistor including a semiconductor film, a gate insulating film, and a gate electrode. The semiconductor film functions as a channel region. The gate insulating film includes a memory portion capable of storing data therein. The memory portion is a charge storage film such as a silicon nitride film (SiN) and a floating gate, for example. In that case, the threshold voltage of the memory cell MC changes in accordance with the quantity of electric charge in the charge storage film. The gate electrode is connected to a word line WL. The word lines WL are provided so as to correspond to the plurality of memory cells MC belonging to one memory string MS, and are commonly connected to all of the memory strings MS in one memory block MB.

The select transistors (STD and STS) are field effect transistors including a semiconductor film, a gate insulating film, and a gate electrode. The semiconductor film functions as a channel region. The gate electrode of the drain select transistor STD is connected to a drain select line SGD. The drain select line SGD is provided so as to correspond to the subblock SB, and commonly connected to all of the drain select transistors STD in one subblock SB. The gate electrode of the source select transistor STS is connected to a source select line SGS. The source select line SGS is commonly connected to all of the source select transistors STS in one memory block MB.

The peripheral circuit PC generates voltage necessary for a reading operation, a writing operation, and an erasing operation, for example, and applies the voltage to the bit line BL, the source line SL, the word line WL, and select gate lines (SGD, SGS). The peripheral circuit PC includes a plurality of transistors and wiring provided on the same chip as the memory cell array MA, for example.

Figure 2:
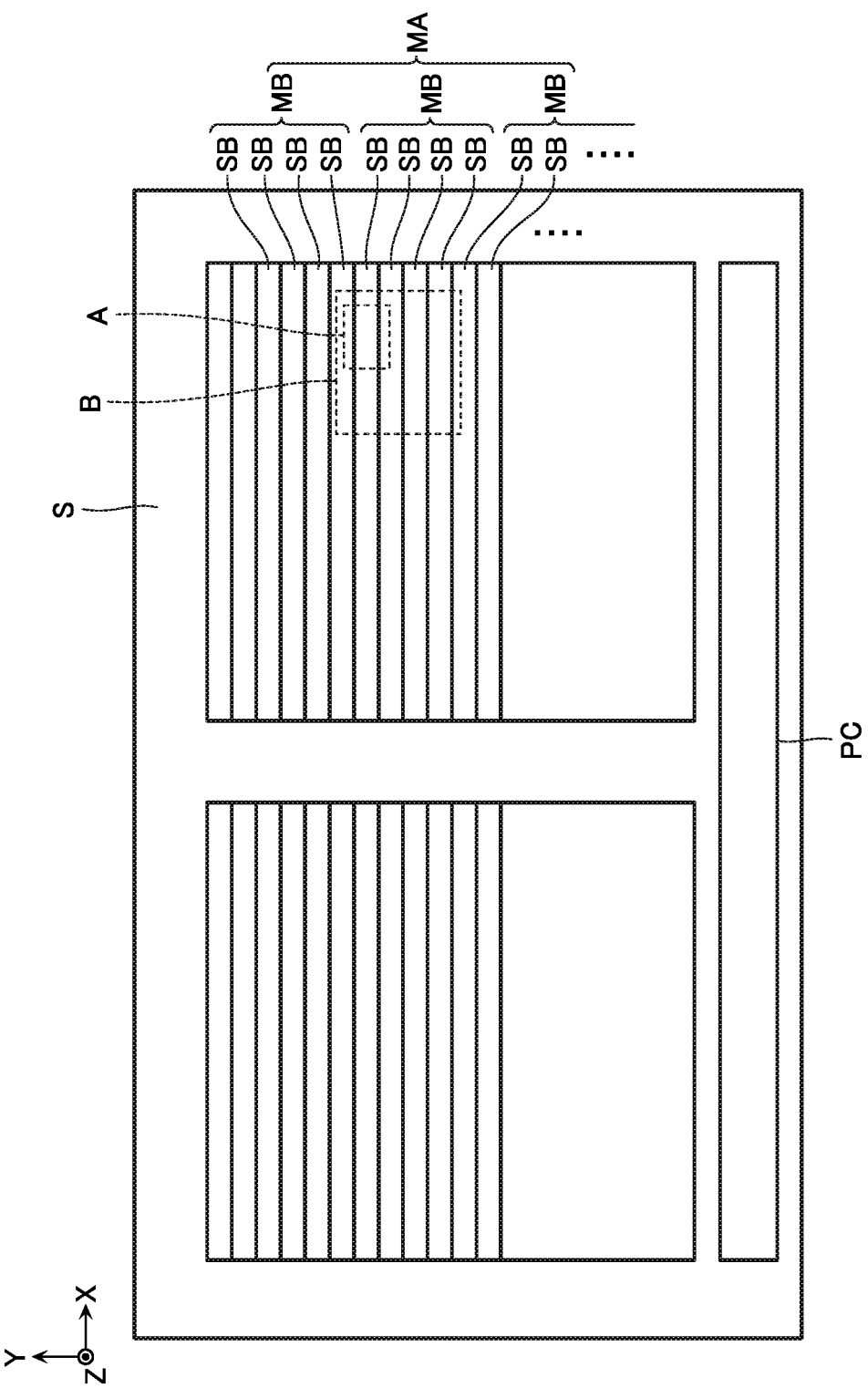
FIG. 2 is a schematic plan view of the semiconductor memory device.

FIG. 2 is a schematic plan view of the semiconductor memory device according to this embodiment. For convenience of description, a part of the configuration is omitted in FIG. 2.

In this embodiment, the memory cell array MA and the peripheral circuit PC are provided on a substrate S. In the illustrated example, two memory cell arrays MA are provided on the substrate S and arranged in the X direction. The memory cell array MA includes the plurality of memory blocks MB arranged in the Y direction. Further, those plurality of memory blocks MB include the plurality of subblocks SB arranged in the Y direction.

Next, with reference to FIG. 3 to FIG. 6, the schematic configuration of the memory cell array MA and the like is described. For convenience of description, a part of the configuration is omitted in FIG. 3 to FIG. 6.

Figure 3:
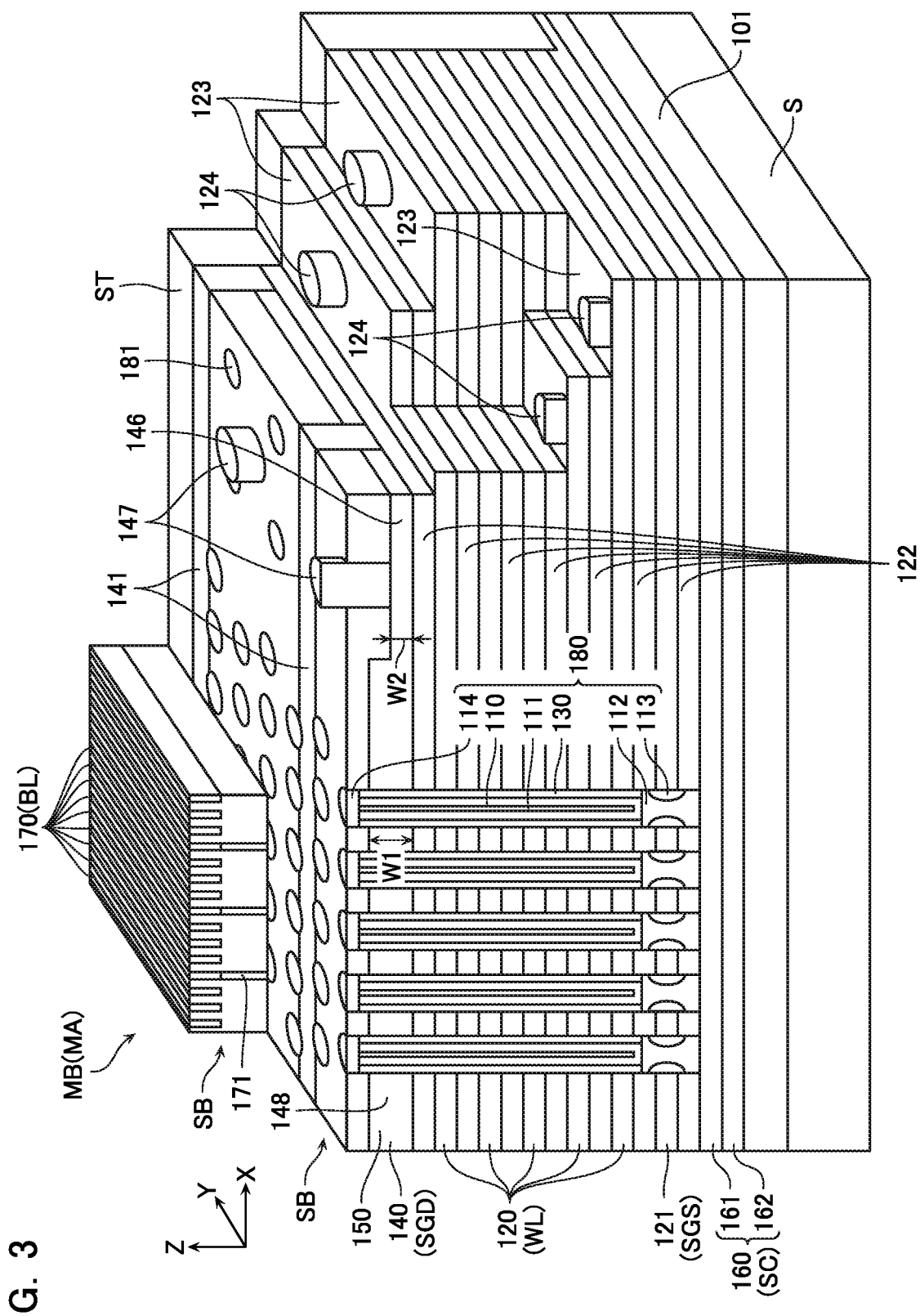
FIG. 3 is a schematic perspective view of a memory cell array MA.

FIG. 3 is a schematic perspective view illustrating the configuration of the part illustrated in A of FIG. 2. FIG. 3 illustrates the substrate S, and the memory cell array MA provided on the substrate S.

The substrate S is a semiconductor substrate formed by a single crystal silicon (Si) and the like, for example. The substrate S has a double-well structure including an n-type impurity layer on an upper surface of the semiconductor substrate and further including a p-type impurity layer in the n-type impurity layer, for example. Note that a layer 101 provided on the surface of the substrate S may be an insulating layer, or may include a transistor forming a part of the peripheral circuit PC.

The memory cell array MA includes a plurality of semiconductor layers 110 extending in the Z direction, a plurality of conductive layers 120 opposed to the semiconductor layers 110, gate insulating films 130 provided between the semiconductor layers 110 and the conductive layers 120, a conductive layer 140 provided above the plurality of conductive layers 120 and opposed to the semiconductor layers 110, a gate insulating film 150 provided between the semiconductor layers 110 and the conductive layers 140, wiring 160 connected to lower ends of the semiconductor layer 110, and a plurality of wiring 170 connected to upper ends of the semiconductor layer 110. A substantially cylindrical configuration including the semiconductor layer 110, the gate insulating film 130, and the like may be hereinafter referred to as a memory structure 180.

A plurality of the semiconductor layers 110 are arranged in the X direction and the Y direction, and the semiconductor layers 110 are substantially cylindrical semiconductor layers extending in the Z direction. The semiconductor layer 110 functions as a channel region of the drain select transistor STD and the plurality of memory cells MC included in one memory unit MU (FIG. 1). An insulating layer 111 of silicon oxide ($SiO_2$) and the like is embedded in the central portion of the semiconductor layer 110. The semiconductor layer 110 is a semiconductor layer of non-doped polycrystalline silicon (p-Si) and the like, for example.

The lower end of the semiconductor layer 110 is connected to a semiconductor layer 112. The semiconductor layer 112 is opposed to a conductive layer 121 via a gate insulating film 113, and functions as a channel region of the source select transistor STS (FIG. 1). The semiconductor layer 112 is a semiconductor layer of non-doped polycrystalline silicon (p-Si) and the like, for example.

The upper end of the semiconductor layer 110 is connected to a semiconductor layer 114. The semiconductor layer 114 is a semiconductor layer in which an n-type impurity such as phosphorus (P) is implanted, for example.

A plurality of the conductive layers 120 are arranged in the Z direction, and the conductive layers 120 are substantially plate-shaped conductive layers extending in the X direction and the Y direction. The conductive layer 120 functions as one word line WL (FIG. 1) and gate electrodes of plurality of memory cells MC connected to the word line WL.

Figure 4:
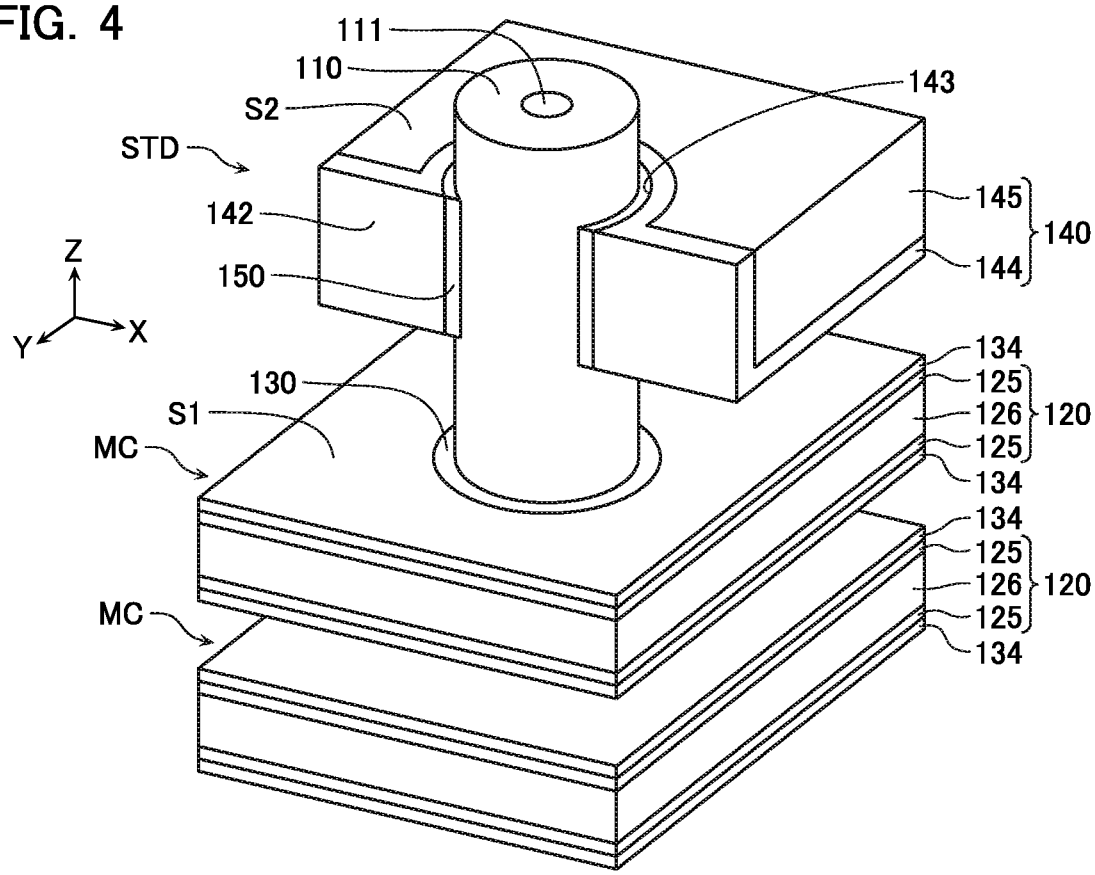
FIG. 4 is a schematic perspective view of a memory cell MC and a drain select transistor STD.

The conductive layer 120 has a plurality of through holes formed in a predetermined pattern, and the semiconductor layers 110 and the gate insulating films 130 are placed in those through holes. That is, for example, as illustrated in FIG. 4, in a predetermined XY cross section S1, the conductive layer 120 surrounds an entire outer peripheral surface of the semiconductor layer 110.

Figure 5:
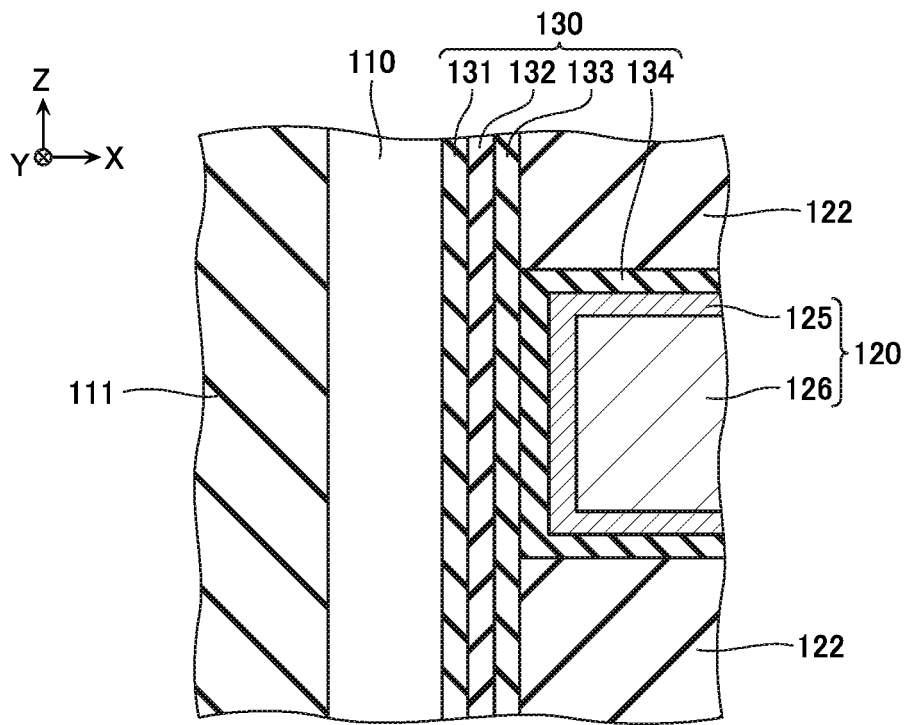
FIG. 5 is a schematic cross-sectional view of the memory cell MC.

As illustrated in FIG. 5, the conductive layer 120 is a laminated film including a barrier metal film 125 of titanium nitride (TiN) and the like and a metal film 126 of tungsten (W) and the like, for example. The barrier metal film 125 covers the inner peripheral surface of the through hole in the metal film 126, and extends in the X direction and the Y direction along an upper surface and a lower surface of the metal film 126.

As illustrated in FIG. 3, the conductive layer 121 is further provided between the conductive layer 120 and the wiring 160. The conductive layer 121 functions as the source select line SGS (FIG. 1) and gate electrodes of plurality of source select transistors STS connected to the source select line. The conductive layer 121 has a configuration similar to that of the conductive layer 120.

An insulating layer 122 of silicon oxide ($SiO_2$) and the like is provided between the conductive layers 120 and 121. Further, a contact portion 123 is provided on an end portion of the conductive layer 120 in the X direction. The contact portion 123 is connected to a contact 124 extending in the Z direction.

The gate insulating film 130 is provided on each intersecting portion between the semiconductor layer 110 and the conductive layer 120. As illustrated in FIG. 5, the gate insulating film 130 includes a tunnel insulating film 131, a charge storage film 132, a block insulating film 133, and a high dielectric insulating film 134 laminated between the semiconductor layer 110 and the conductive layer 120, for example. The tunnel insulating film 131 and the block insulating film 133 are insulating films of silicon oxide ($SiO_2$) and the like, for example. The charge storage film 132 is a film that can store electric charge such as a film of silicon nitride (SiN) and the like, for example. The high dielectric insulating film 134 is a film having a high dielectric constant such as a film of alumina ($Al_2O_3$), hafnium oxide (HfO), or the like, for example.

Some films (131, 132, and 133) included in the gate insulating film 130 extend in the Z direction along the outer peripheral surface of the semiconductor layer 110. Meanwhile, some films (134) included in the gate insulating film 130 cover an inner peripheral surface of the through hole in the conductive layer 120, and extend in the X direction and the Y direction along an upper surface and a lower surface of the conductive layer 120.

As illustrated in FIG. 3, a plurality of the conductive layers 140 are arranged in the Y direction via an insulating layer 141, and the conductive layers 140 are substantially plate-shaped conductive layers extending in the X direction. The conductive layer 140 functions as one drain select line SGD (FIG. 1) and gate electrodes of plurality of drain select transistors STD (FIG. 1) connected to the drain select line SGD.

The conductive layer 140 has a plurality of through holes 148 formed in a predetermined pattern, and the semiconductor layers 110 and the gate insulating films 150 are placed in those through holes 148. That is, in a predetermined XY cross section, the conductive layer 140 surrounds the outer peripheral surface of the semiconductor layer 110. Further, as illustrated in FIG. 4, a recessed portion 143 corresponding to a part of the shape of the through hole 148 is formed in a side surface of the conductive layer 140 in the Y direction. That is, the recessed portions 143 and a plurality of plane portions 142 arranged in the X direction are provided on the side surface of the conductive layer 140 in the Y direction, and the semiconductor layer 110 and the gate insulating film 150 are also placed in the recessed portions 143. In a predetermined XY cross section S2, the recessed portion 143 is opposed to a part of the outer peripheral surface of the semiconductor layer 110.

Figure 6:
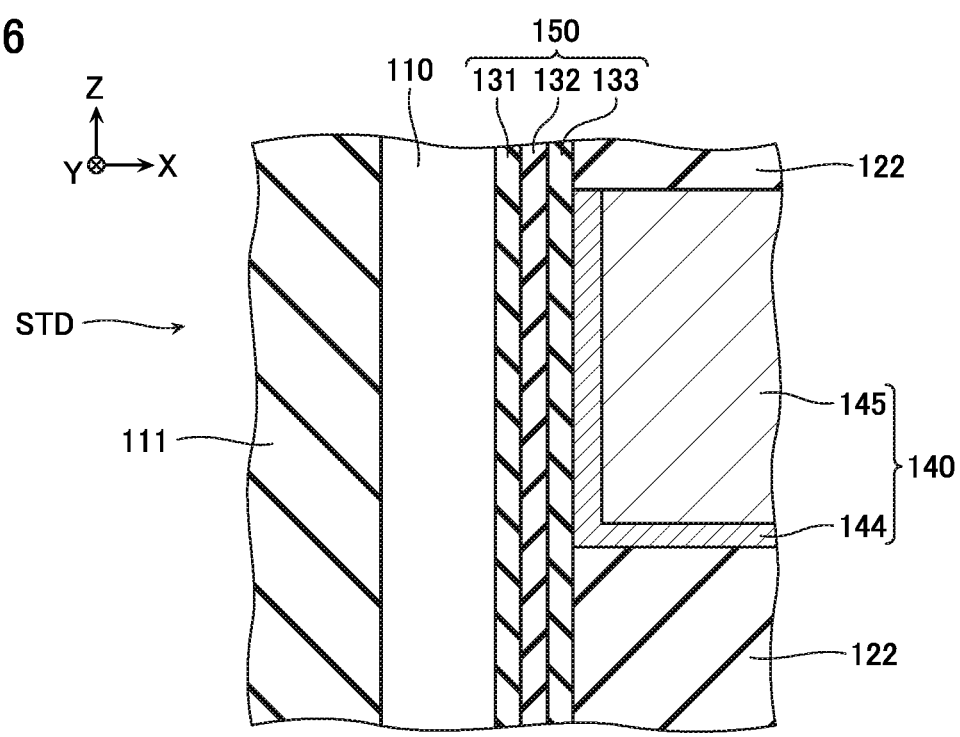
FIG. 6 is a schematic cross-sectional view of the drain select transistor STD.

As illustrated in FIG. 6, the conductive layer 140 is a laminated film including a barrier metal film 144 of titanium nitride (TiN) and the like and a metal film 145 of tungsten (W) and the like, for example. The barrier metal film 144 covers a side surface of the metal film 145 in the X direction and an inner peripheral surface of the through hole, and extends in the X direction and the Y direction along a lower surface of the metal film 145. Note that the barrier metal film 144 is not provided on an upper surface of the metal film 145. In the illustrated example, the upper surface of the metal film 145 becomes an upper surface of the conductive layer 140.

As illustrated in FIG. 3, a contact portion 146 is provided on an end portion of the conductive layer 140 in the X direction. The contact portion 146 is connected to a contact 147 extending in the Z direction. Note that a thickness W2 of the contact portion 146 (second portion) of the conductive layer 140 in the Z direction is thinner than a thickness W1 of the part of the conductive layer 140 opposed to the semiconductor layer 110 (first portion) in the Z direction.

The gate insulating film 150 is provided on each intersecting portion between the semiconductor layer 110 and the conductive layer 140. As illustrated in FIG. 6, for example, the gate insulating film 150 includes the tunnel insulating film 131, the charge storage film 132, and the block insulating film 133 laminated between the semiconductor layer 110 and the conductive layer 140. In the illustrated example, the tunnel insulating film 131, the charge storage film 132, and the block insulating film 133 extend in the Z direction along the outer peripheral surface of the semiconductor layer 110.

As illustrated in FIG. 3, the wiring 160 is a substantially plate-shaped conductive layer extending in the X direction and the Y direction. The wiring 160 (FIG. 3) functions as the lower wiring SC (FIG. 1). The wiring 160 includes a semiconductor layer 161 and a metal layer 162, for example.

The semiconductor layer 161 is a semiconductor layer in which an n-type impurity such as phosphorus (P) is implanted, for example, and is connected to the plurality of semiconductor layers 112. The metal layer 162 is a laminated film including a barrier metal film of titanium nitride (TiN) and the like and a metal film of tungsten (W) and the like, for example.

The wiring 170 extends in the Y direction, and a plurality of the wiring 170 are arranged in the X direction. The wiring 170 functions as the bit line BL (FIG. 1). The wiring 170 is connected to the semiconductor layer 114 via a contact (electrode) 171 extending in the Z direction. The wiring 170 and the contact 171 are laminated films including a barrier metal film of titanium nitride (TiN) and the like and a metal film of tungsten (W) and the like, for example.

The memory structure 180 functions as the memory unit MU (FIG. 1). The memory structure 180 is a substantially cylindrical configuration including the semiconductor layer 110, the insulating layer 111, the semiconductor layer 112, the gate insulating film 113, the semiconductor layer 114, the gate insulating film 130, and the gate insulating film 150. Further, a dummy structure 181 is provided near the contact 147 and the like. The dummy structure 181 has a structure substantially similar to the memory structure 180. However, an upper end of the dummy structure 181 is not connected to the contact 171. The dummy structure 181 suppresses a collapse of a structure formed during a manufacturing process.

Next, with reference to FIG. 7A to FIG. 9, a more specific configuration of the memory cell array MA is described. For convenience of description, a part of the configuration is omitted in FIG. 7A to FIG. 9.

FIG. 7A is an enlarged view of the region illustrated in B of FIG. 2. As illustrated, in the memory cell array MA, the plurality of memory blocks MB are arranged in the Y direction via the block separation structure ST. The memory block MB includes a memory region MR in which the plurality of memory structures 180 are arranged, and a contact region CR in which the plurality of contacts 123 and 146 are arranged.

In the memory region MR, the plurality of memory structures 180 are placed in a uniform pattern regardless of a layout of the conductive layer 140.

The pattern in which the memory structures 180 are placed can be changed, as appropriate. For example, in the illustrated example, the memory structures 180 are arranged in a pattern in which the central positions of adjacent thee memory structures 180 are located on vertices of an equilateral triangle. However, for example, a pattern in which the central positions of three adjacent memory structures 180 are located on vertices of a rectangular equilateral triangle may be employed, or a pattern in which the central positions of three adjacent memory structures 180 are located on vertices of other isosceles triangles may be employed. Further, a pattern in which the central positions of four adjacent memory structures 180 are located on vertices of a square may be employed, or the memory structures 180 may be arranged in other periodic patterns.

A number of patterns in which the memory structures 180 are placed are exemplified. As exemplified in FIG. 7A, those patterns include three memory structures 180a, 180b, and 180c having different positions in the Y direction in accordance with the positional relationship with a subblock separation structure SHE (insulating layer 141). Such three memory structures 180 are hereinafter referred to as a first memory structure 180a, a second memory structure 180b, and a third memory structure 180c. In the illustrated example, the central positions of those first to third memory structures 180*a*, 180*b*, and 180*c* are arranged at approximately equal intervals along a linear line L intersecting the X direction and the Y direction on an XY plane. Further, the first memory structure 180*a* and the third memory structure 180*c* are included in the plurality of memory structures 180*d* closest to the second memory structure 180*b*. For example, in the illustrated example, six memory structures 180*d* are placed near the second memory structure 180*b*. The distance from the first memory structure 180*a* to the second memory structure 180*b* substantially matches with the distance from the third memory structure 180*c* to the second memory structure 180*b*. Those distances also substantially match with the distance from another memory structure 180*d* to the second memory structure 180*b*. Note that, in the illustrated example, the outer peripheral surfaces of the first memory structure 180*a* and the second memory structure 180*b* are covered with the same conductive layer 140 (first conductive layer 140*a*), and the outer peripheral surface of the third memory structure 180*c* is covered with another conductive layer 140 (second conductive layer 140*b*).

Further, in the memory region MR, the plurality of conductive layers 140 are arranged in the Y direction via the subblock separation structure SHE. In this embodiment, regardless of the layout of the memory structures 180, a certain distance is provided between the conductive layers 140 adjacent to each other in the Y direction. Meanwhile, the memory structures 180 are placed in a substantially uniform pattern on the XY plane, and the minimum interval between the memory structures 180 in the Y direction is shorter than the width of the subblock separation structure SHE in the Y direction. As a result, some of the memory structures 180 are sticking out from the side surface of the conductive layer 140 in the Y direction. That is, while the entire outer peripheral surfaces of some of the memory structures 180 are surrounded by the conductive layer 140, the outer peripheral surfaces of some of the memory structures 180 are surrounded by the conductive layer 140 and the insulating layer 141.

For example, in the XY cross section corresponding to FIG. 7A, the first conductive layer 140*a* surrounds the entire outer peripheral surface of the first memory structure 180*a*. Further, a recessed portion opposed to a part of the outer peripheral surface of the second memory structure 180*b* is formed in a side surface of the first conductive layer 140*a* in the Y direction. Further, a recessed portion opposed to a part of the outer peripheral surface of the third memory structure 180*c* is formed in a side surface of the second conductive layer 140*b* on the first conductive layer 140*a* side. In addition, the insulating layer 141 is in contact with a part of the outer peripheral surfaces of the second memory structure 180*b* and the third memory structure 180*c*. Note that, although not shown, in a predetermined XY cross section, the conductive layer 120 surrounds an entire outer peripheral surface of the first memory structure 180*a*, an entire outer peripheral surface of the second memory structure 180*b*, and an entire outer peripheral surface of the third memory structure 180*c*.

Figure 7B:
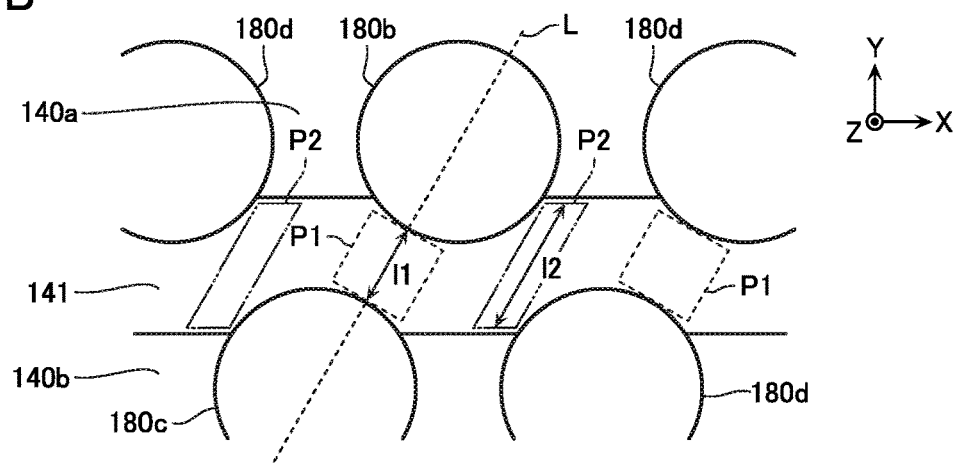
FIG. 7B is an enlarged view of a part of FIG. 7A.

Further, as illustrated in FIG. 7B in an enlarged manner, the insulating layer 141 includes a plurality of narrow portions P1 arranged in the X direction, and a plurality of wide portions P2 placed between those plurality of narrow portions P1. The narrow portions P1 are arranged with the memory structures 180 in a direction parallel to the linear line L. In FIG. 7B, the narrow portion P1 provided between the second memory structure 180*b* and the third memory structure 180*c* is exemplified. The wide portions P2 are arranged with the side surface of the conductive layer 140 in the direction parallel to the linear line L. A length l2 of the wide portion P2 in the direction parallel to the linear line L is longer than a length l1 of the narrow portion P1 in the direction parallel to the linear line L.

Figure 8:
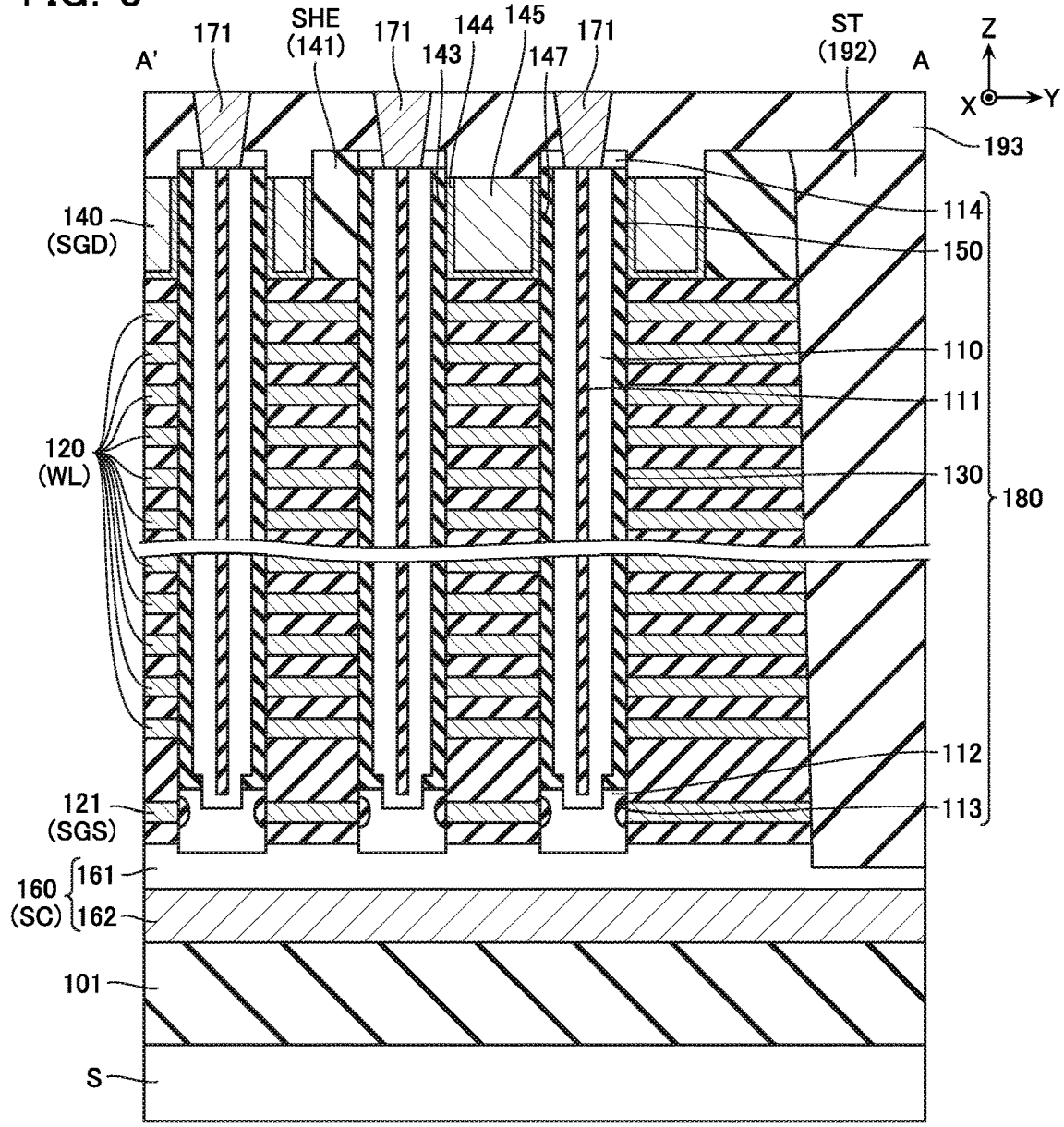
FIG. 8 is a schematic cross-sectional view of the memory cell array MA.

FIG. 8 is a cross-sectional view of the structure illustrated in FIG. 7A taken along the line A-A' and seen along the direction of the arrow. In this cross section, the conductive layers 120 are opposed to the plurality of memory structures 180 from one side (for example, the right side in FIG. 8) and the other side (for example, the left side in FIG. 8) in the Y direction. Further, the gate insulating film 130 included in each of the memory structures 180 is in contact with the outer peripheral surface of the semiconductor layer 110 and the conductive layer 120. Further, as described above, a plurality of the conductive layers 140 are arranged in the Y direction via the insulating layer 141. The conductive layers 140 are opposed to some of the memory structures 180 from one side and the other side in the Y direction. The gate insulating film 150 included in such a memory structure is in contact with the outer peripheral surface of the semiconductor layer 110 and the conductive layer 140. Further, the conductive layers 140 are opposed to some of the memory structures 180 from only one side in the Y direction at an end surface corresponding to the abovementioned recessed portion 143. The gate insulating film 150 included in such a memory structure 180 is in contact with the outer peripheral surface of the semiconductor layer 110, the conductive layer 140, and the insulating layer 141.

As illustrated in FIG. 7A, the plurality of contact portions 123 and 146 are arranged in the contact region CR in the X direction and the Y direction. Further, the contacts 124 and 147 and the plurality of dummy structures 181 placed around the contacts 124 and 147 are provided in the contact portions 123 and 146.

Figure 9:
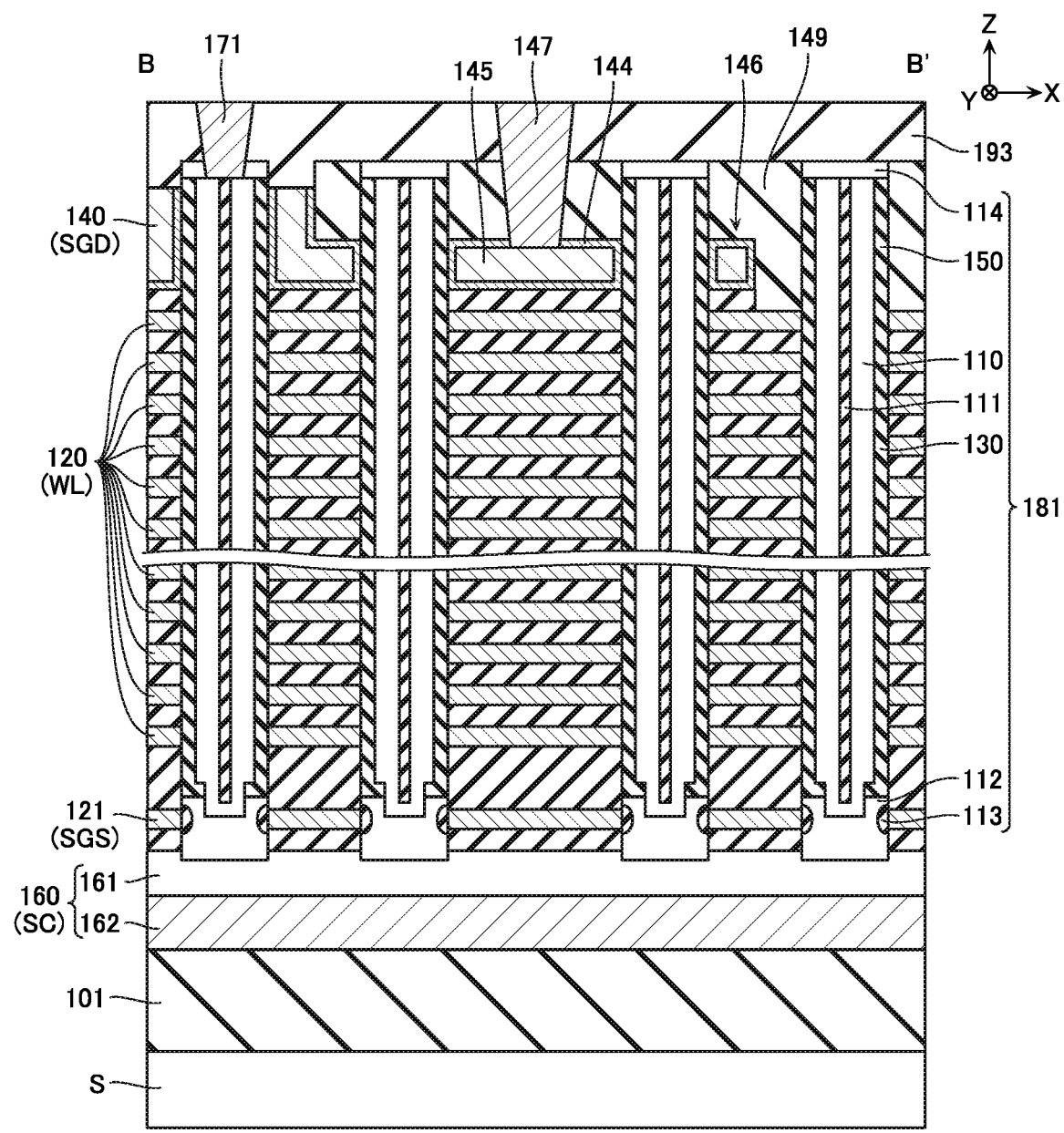
FIG. 9 is a schematic cross-sectional view of the memory cell array MA.

FIG. 9 is a cross-sectional view of the structure illustrated in FIG. 7A taken along the line B-B' and seen along the direction of the arrow. In this cross section, the barrier metal film 144 is provided on an upper surface of the contact portion 146 of the conductive layer 140. The contact 147 is in contact with the metal film 145 by passing through the barrier metal film 144.

[Manufacturing Method]

Next, with reference to FIG. 10 to FIG. 34, a manufacturing method of the semiconductor memory device according to this embodiment is described. Note that FIGS. 10, 13 to 15, 17 to 20, 22 to 23, 25 to 27, 29, 31, and 33 illustrate cross sections corresponding to the line A-A' in FIG. 7A, and FIGS. 11, 12, 16, 21, 24, 28, 30, 32, and 34 illustrate cross sections corresponding to the line B-B' in FIG. 8.

Figure 10:
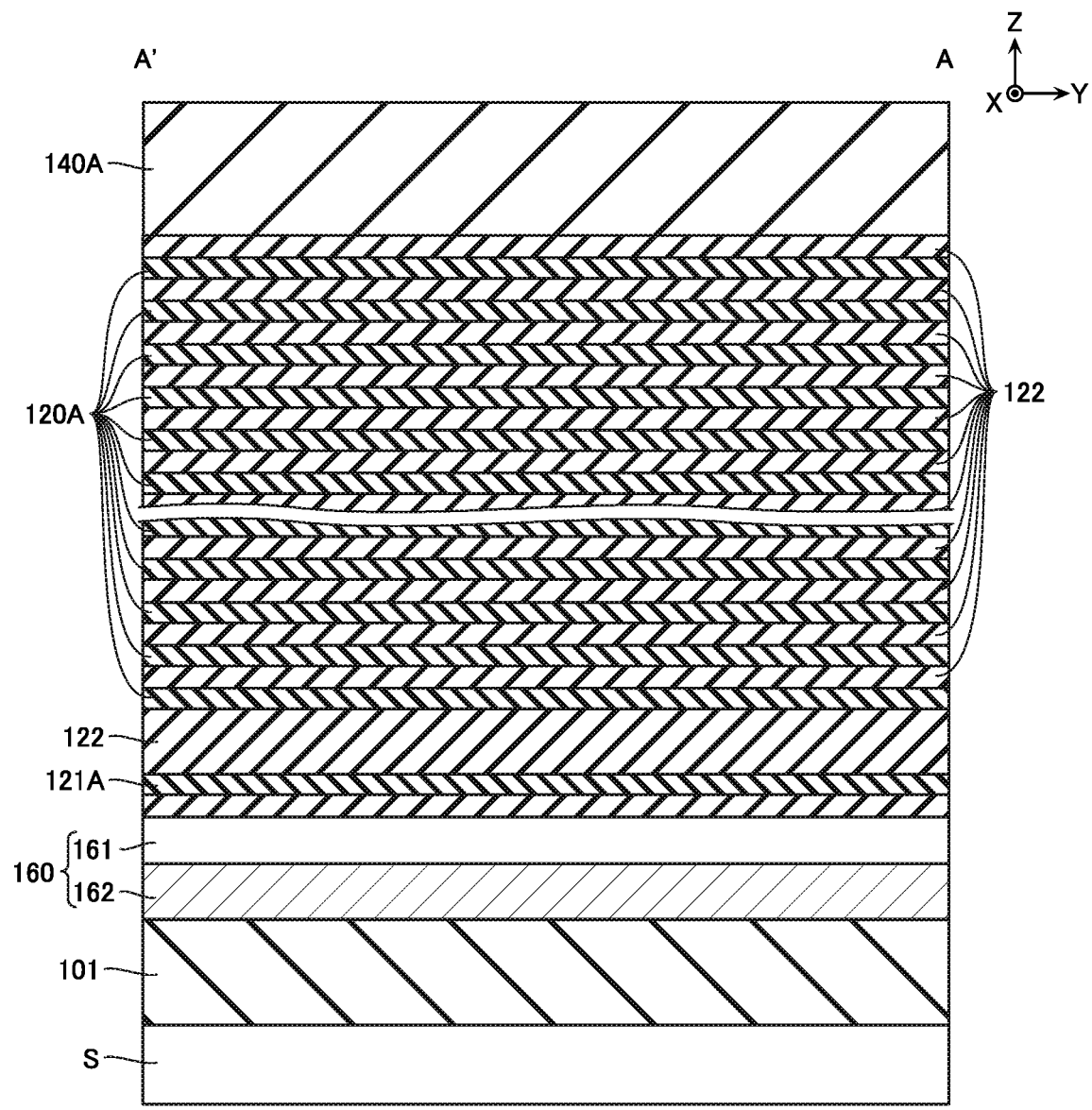
FIG. 10 is a schematic cross-sectional view illustrating a manufacturing method of the semiconductor memory device according to the first embodiment.

As illustrated in FIG. 10, in this manufacturing method, on the substrate S, the layer 101 on the abovementioned substrate S, the wiring 160, a sacrificing layer 121A, a plurality of sacrificing layers 120A and insulating layers 122, and a sacrificing layer 140A are formed. The sacrificing layers 121A, 120A, and 140A are silicon nitride (SiN) and the like, for example. This process is performed by Chemical Vapor Deposition (CVD) and the like, for example.

Figure 11:
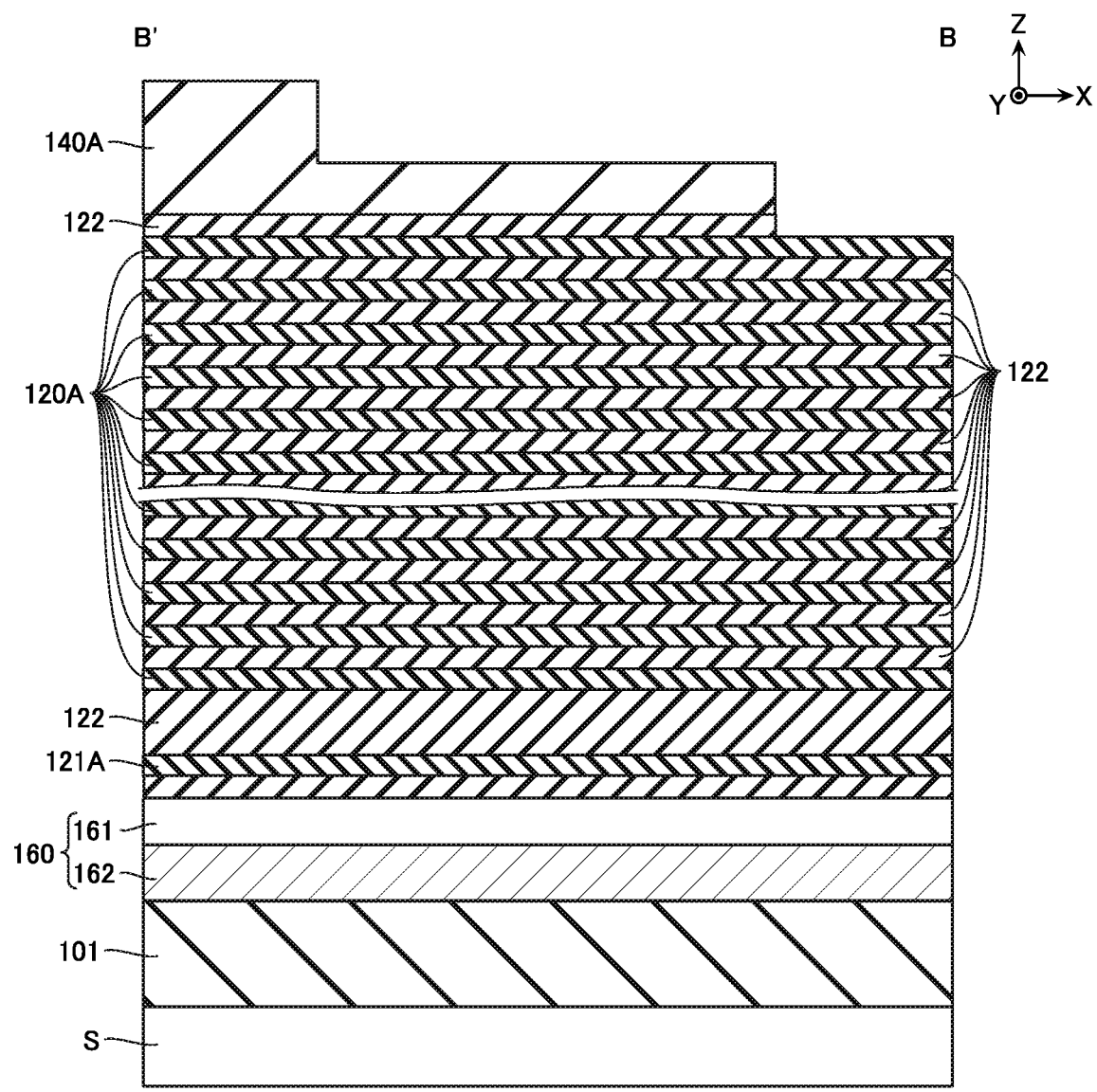
FIG. 11 is a schematic cross-sectional view illustrating the same manufacturing method.

Next, as illustrated in FIG. 11, a step is formed in the sacrificing layer 140A. Further, the plurality of sacrificing layers 120A and insulating layers 122 and the sacrificing layer 140A are processed and a step-like structure as exemplified in FIG. 3 is formed.

The processing of the sacrificing layer 140A is performed by Reactive Ion Etching (RIE) and the like, for example. In this process, a part of the sacrificing layer 140A is removed, and the Z-direction thickness of the end portion of the sacrificing layer 140A in the X direction is caused to be thinner than other parts.

In the processing of the plurality of sacrificing layers 120A and insulating layers 122, first, a resist is formed, for example. Next, the removal (slimming) of a part of the resist, the removal of the sacrificing layers 120A by wet etching using phosphoric acid and the like, and the removal of the insulating layers 122 by wet etching using hydrofluoric acid and the like are repeatedly performed.

Figure 12:
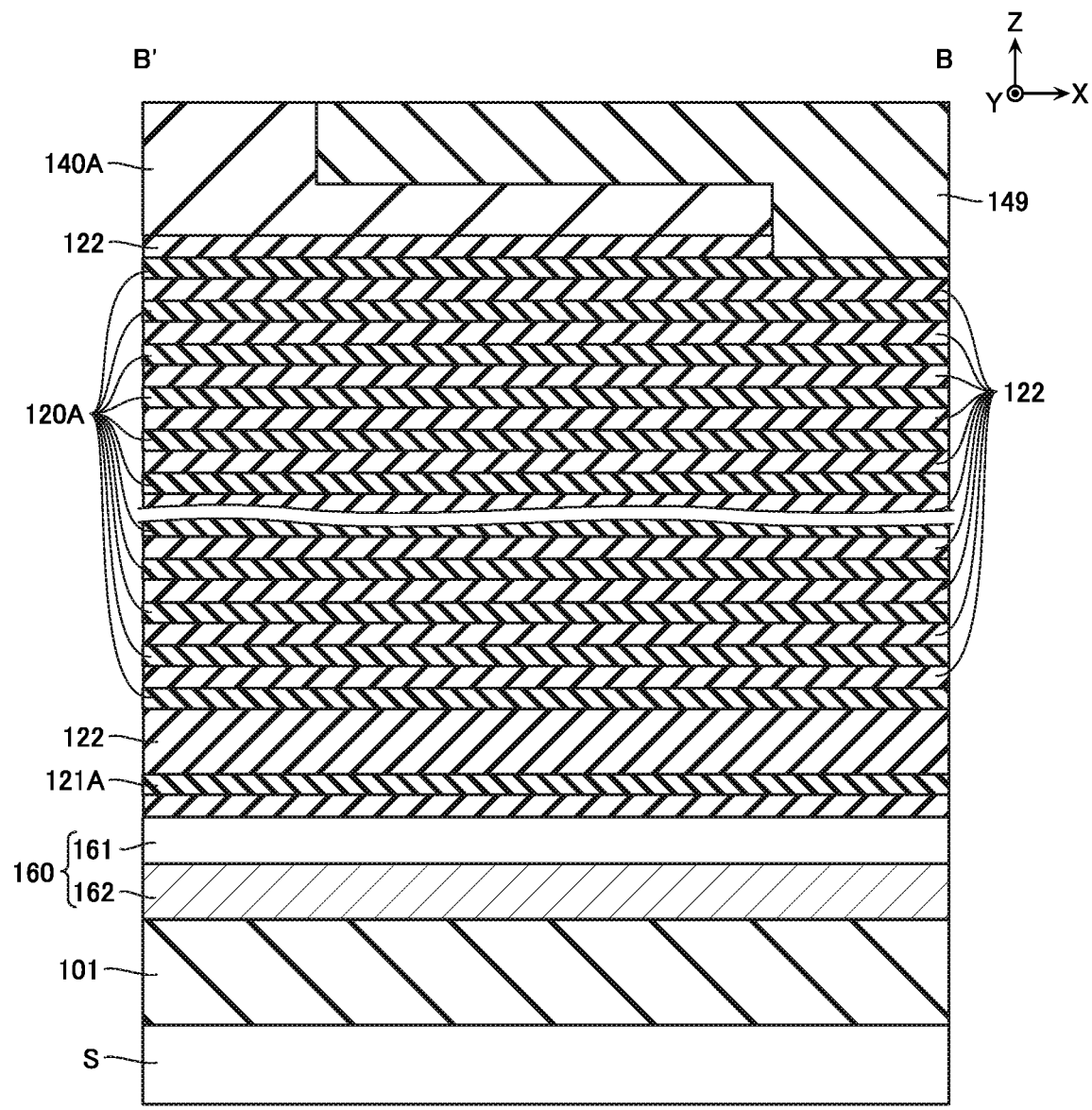
FIG. 12 is a schematic cross-sectional view illustrating the same manufacturing method.

Next, as illustrated in FIG. 12, an insulating layer 149 of silicon oxide ($SiO_2$) and the like is formed. The insulating layer 149 at least covers an end portion of the sacrificing layer 140A in the X direction. This process is performed by deposition through a method such as CVD, and a method such as etch back by RIE, for example.

Figure 13:
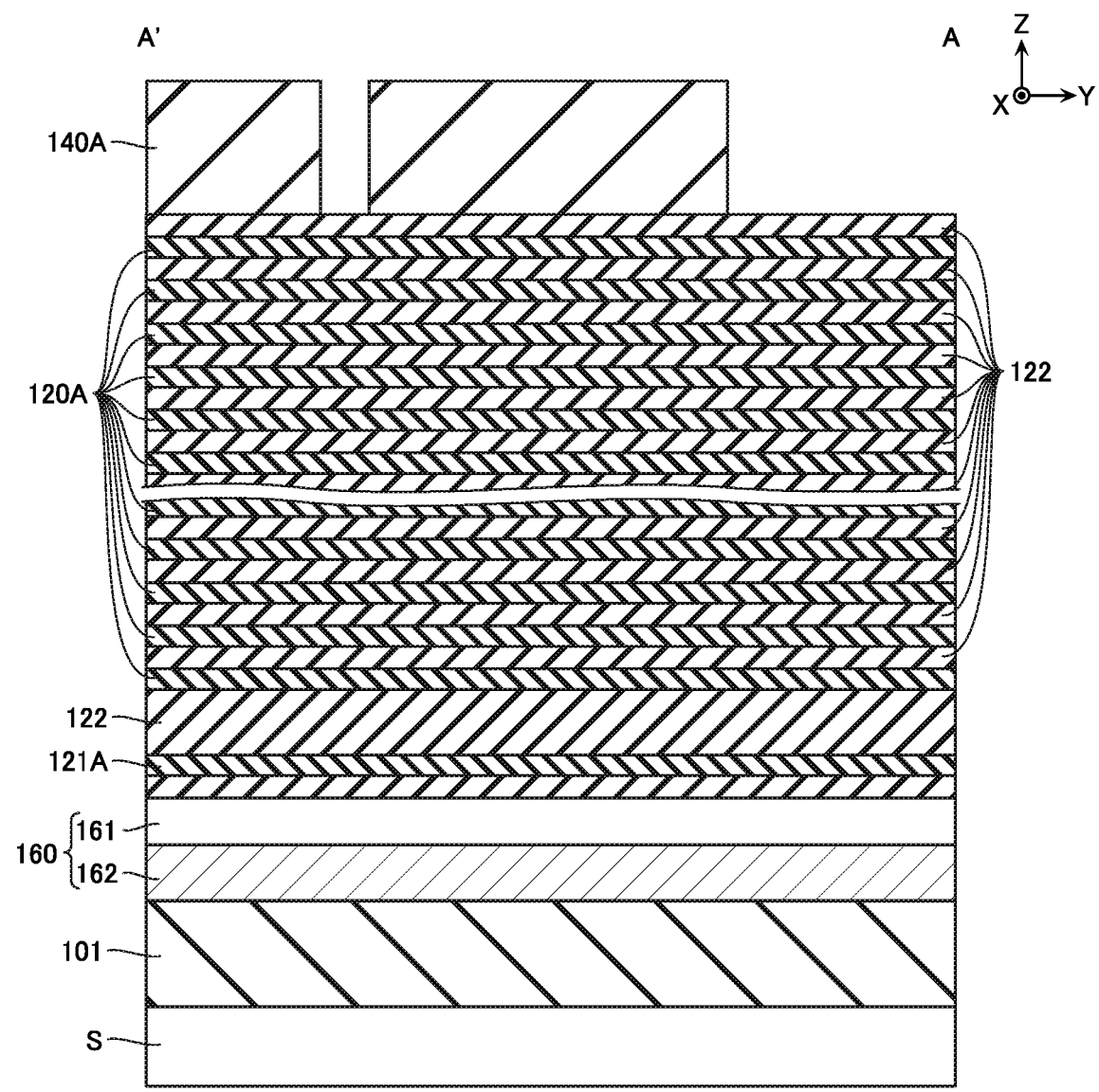
FIG. 13 is a schematic cross-sectional view illustrating the same manufacturing method.

Next, as illustrated in FIG. 13, a groove extending in the X direction is formed in the sacrificing layer 140A and the insulating layer 149, and those layers (140A and 149) are separated in the Y direction. This process is performed by a method such as RIE, for example.

Figure 14:
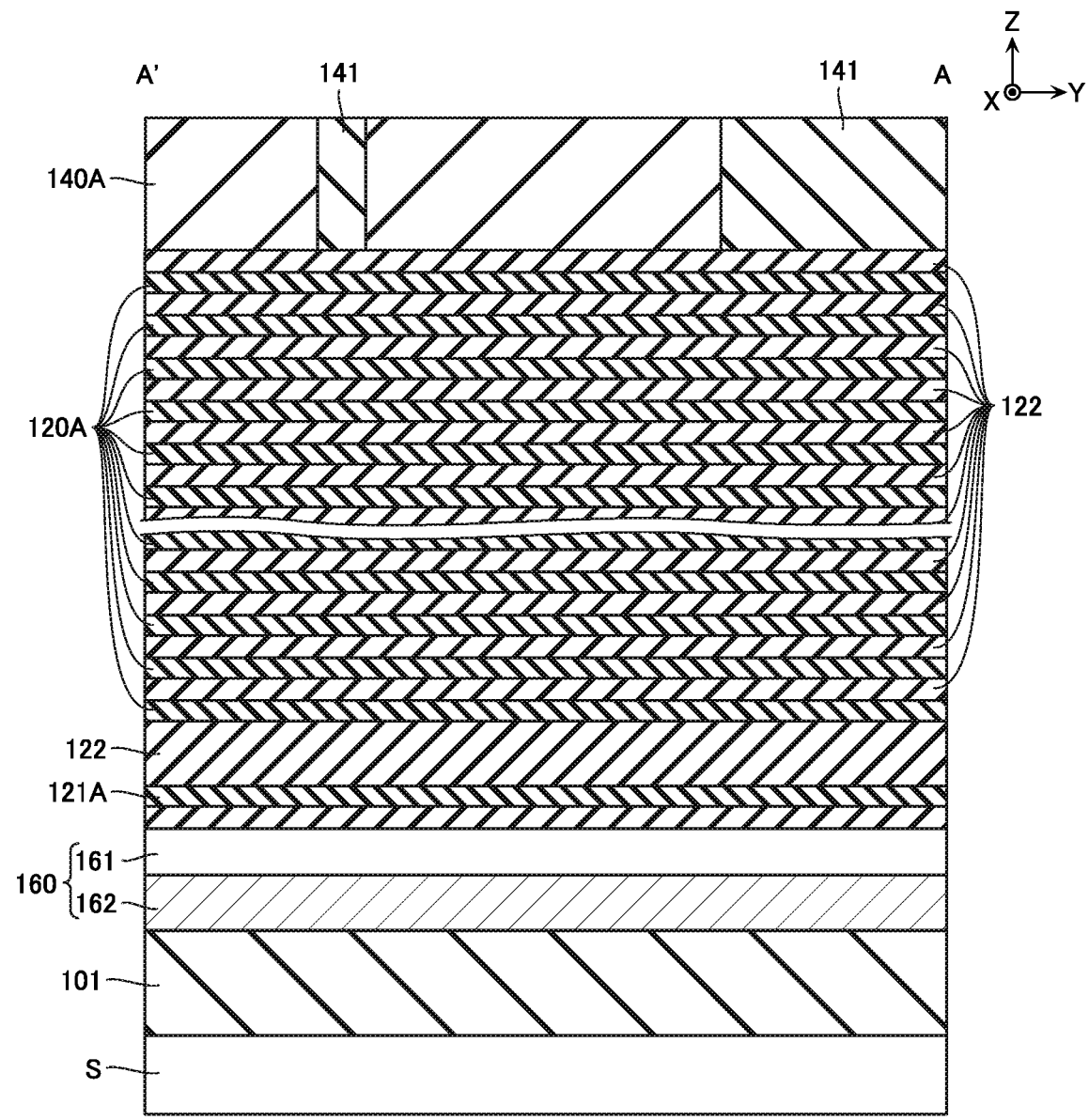
FIG. 14 is a schematic cross-sectional view illustrating the same manufacturing method.

Next, as illustrated in FIG. 14, an insulating layer 141 of silicon oxide ($SiO_2$) and the like is formed in the above-mentioned groove. This process is performed by deposition through a method such as CVD, and a method such as etch back by RIE, for example.

Figure 15:
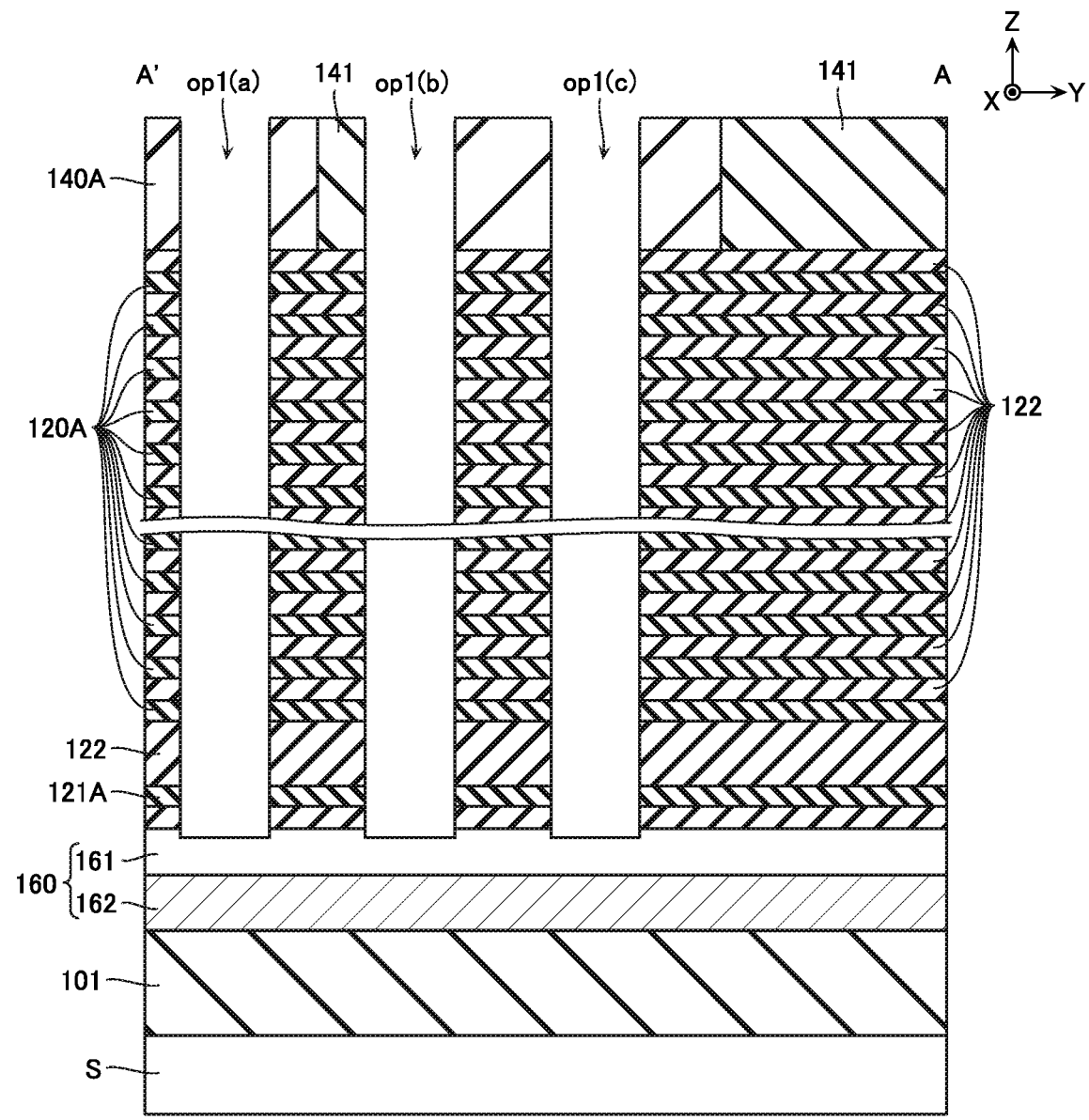
FIG. 15 is a schematic cross-sectional view illustrating the same manufacturing method.
Figure 16:
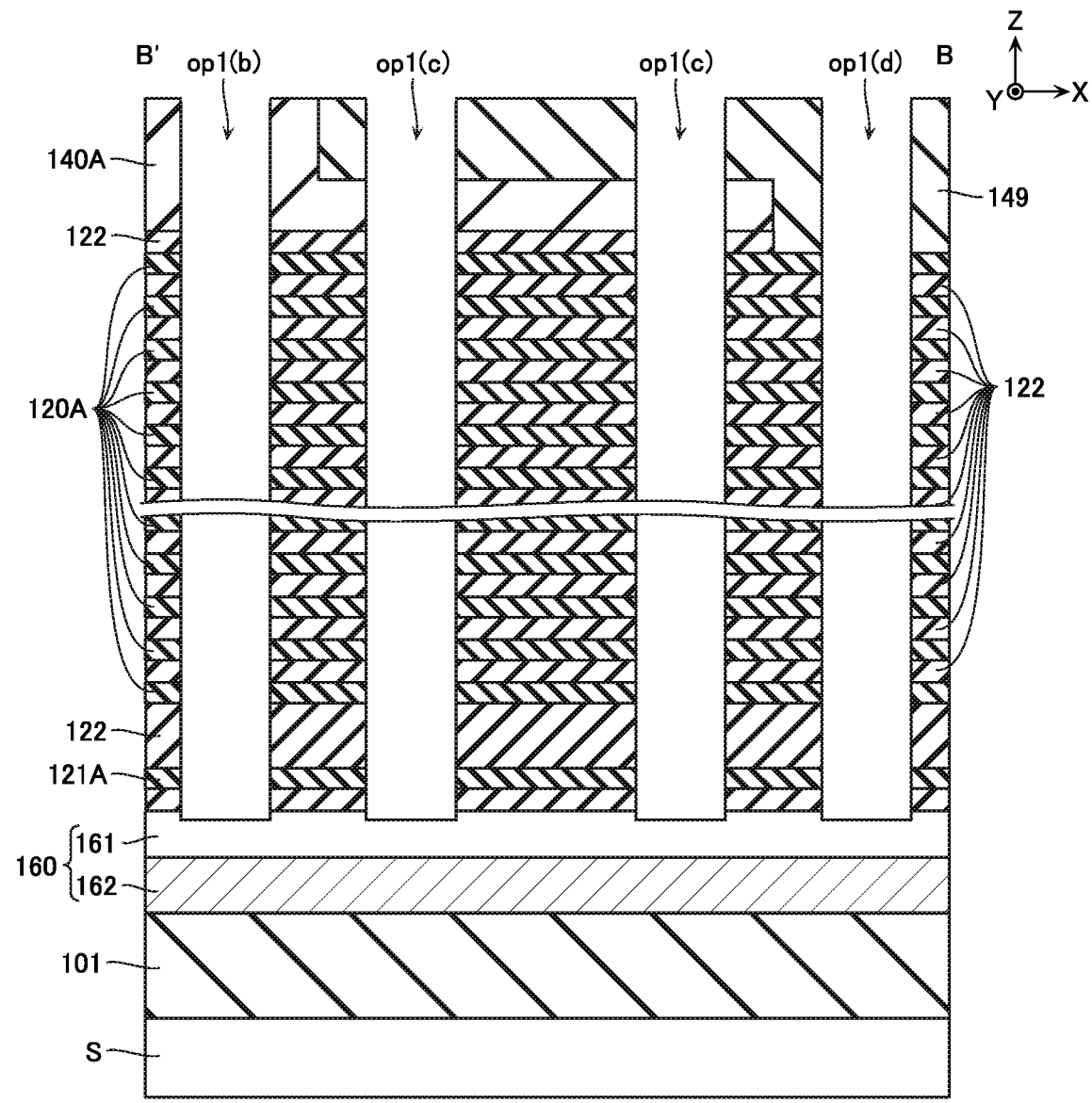
FIG. 16 is a schematic cross-sectional view illustrating the same manufacturing method.

Next, as illustrated in FIG. 15 and FIG. 16, a plurality of openings op1 are formed. The openings op1 are through holes that extend in the Z direction, pass through the insulating layers 122 and the sacrificing layers 120A, and expose the upper surface of the semiconductor layer 161. This process is performed by a method such as RIE, for example.

Note that, as illustrated in FIG. 15, an inner peripheral surface of some openings op1(*a*) includes an inner peripheral surface of a through hole in the sacrificing layer 140A. Further, an inner peripheral surface of other openings op1(*b*) includes parts of Y-direction side surfaces of the sacrificing layer 140A and the insulating layer 141 arranged in the Y direction. Further, as illustrated in FIG. 16, an inner peripheral surface of other openings op1(*c*) includes inner peripheral surfaces of through holes in the sacrificing layer 140A and the insulating layer 149 arranged in the Z direction. Further, an inner peripheral surface of other openings op1(*d*) includes an inner peripheral surface of a through hole in the insulating layer 149.

Figure 17:
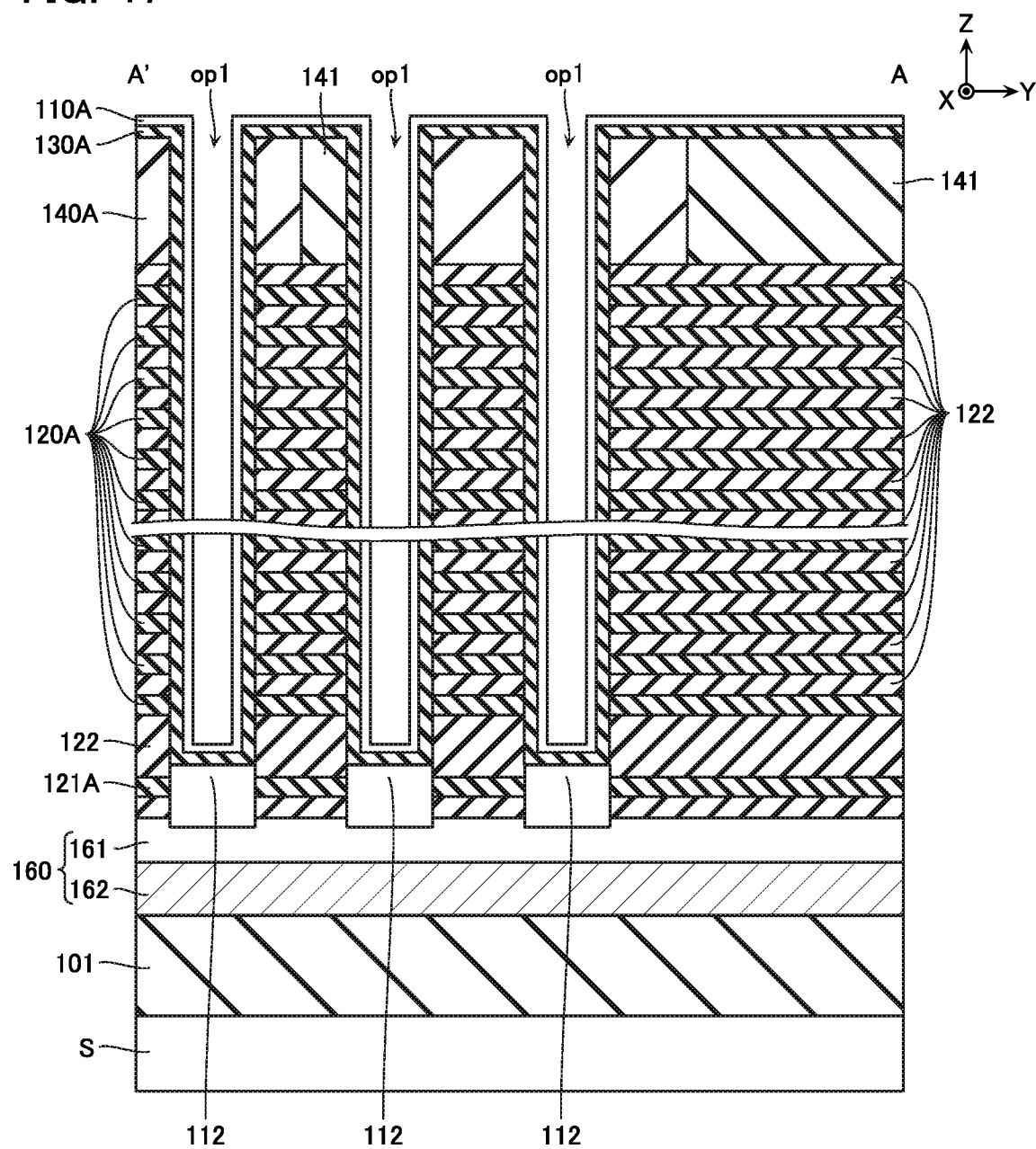
FIG. 17 is a schematic cross-sectional view illustrating the same manufacturing method.

Next, as illustrated in FIG. 17, the semiconductor layer 112 is formed on the bottom surface of the opening op1, and a laminated film 130A and an amorphous silicon layer 110A are sequentially deposited on the upper surface of the semiconductor layer 112 and the inner peripheral surface of the opening op1. The laminated film 130A includes the tunnel insulating film 131, the charge storage film 132, and the block insulating film 133 described with reference to FIG. 5. The semiconductor layer 112 is formed by a method such as epitaxial growth, for example. The laminated film 130A and the amorphous silicon layer 110A are deposited by a method such as CVD, for example.

Figure 18:
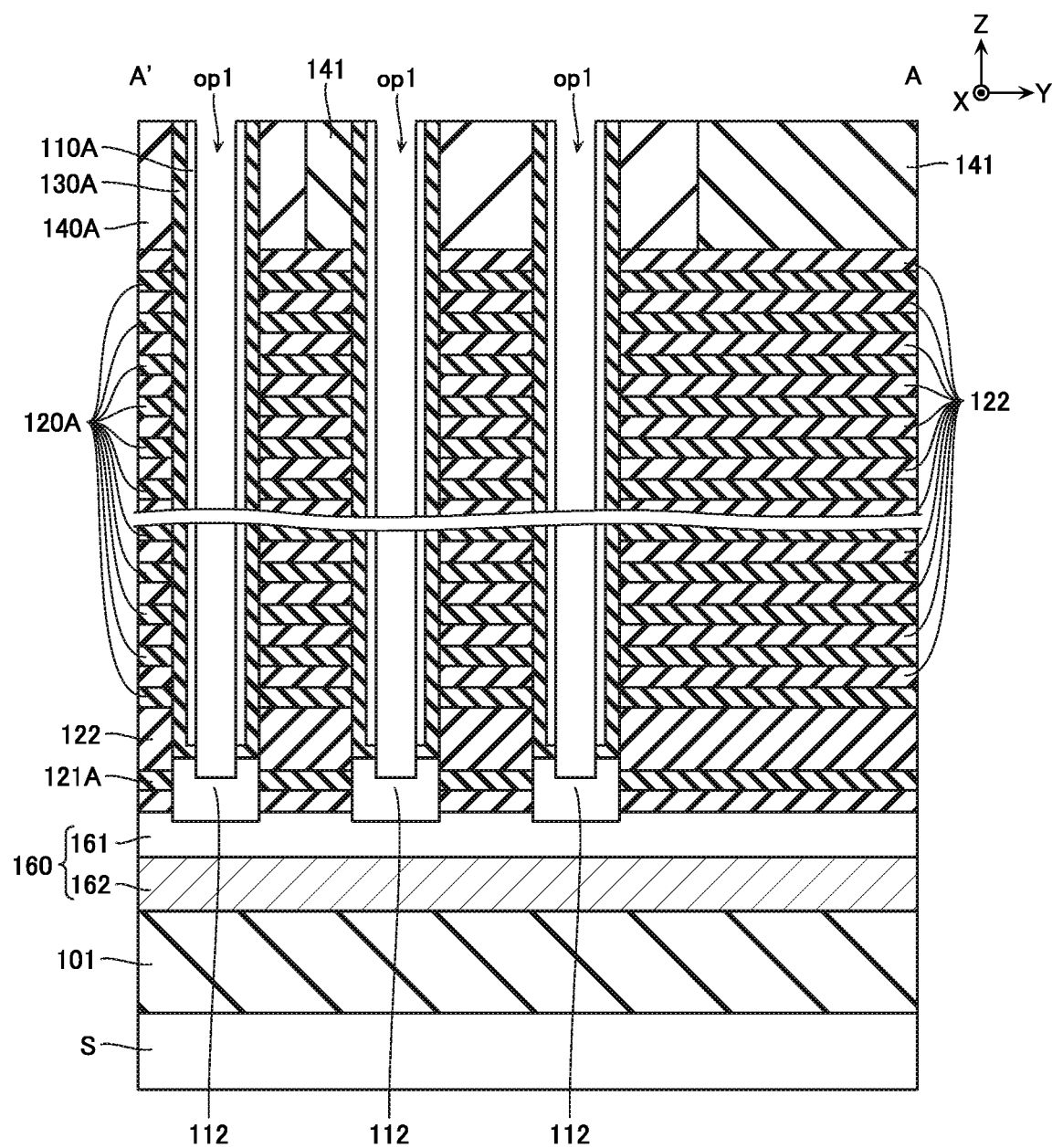
FIG. 18 is a schematic cross-sectional view illustrating the same manufacturing method.

Next, as illustrated in FIG. 18, a part of the laminated film 130A and the amorphous silicon layer 110A that covers the upper surface of the semiconductor layer 112 is removed. This process is performed by RIE and the like, for example.

Figure 19:
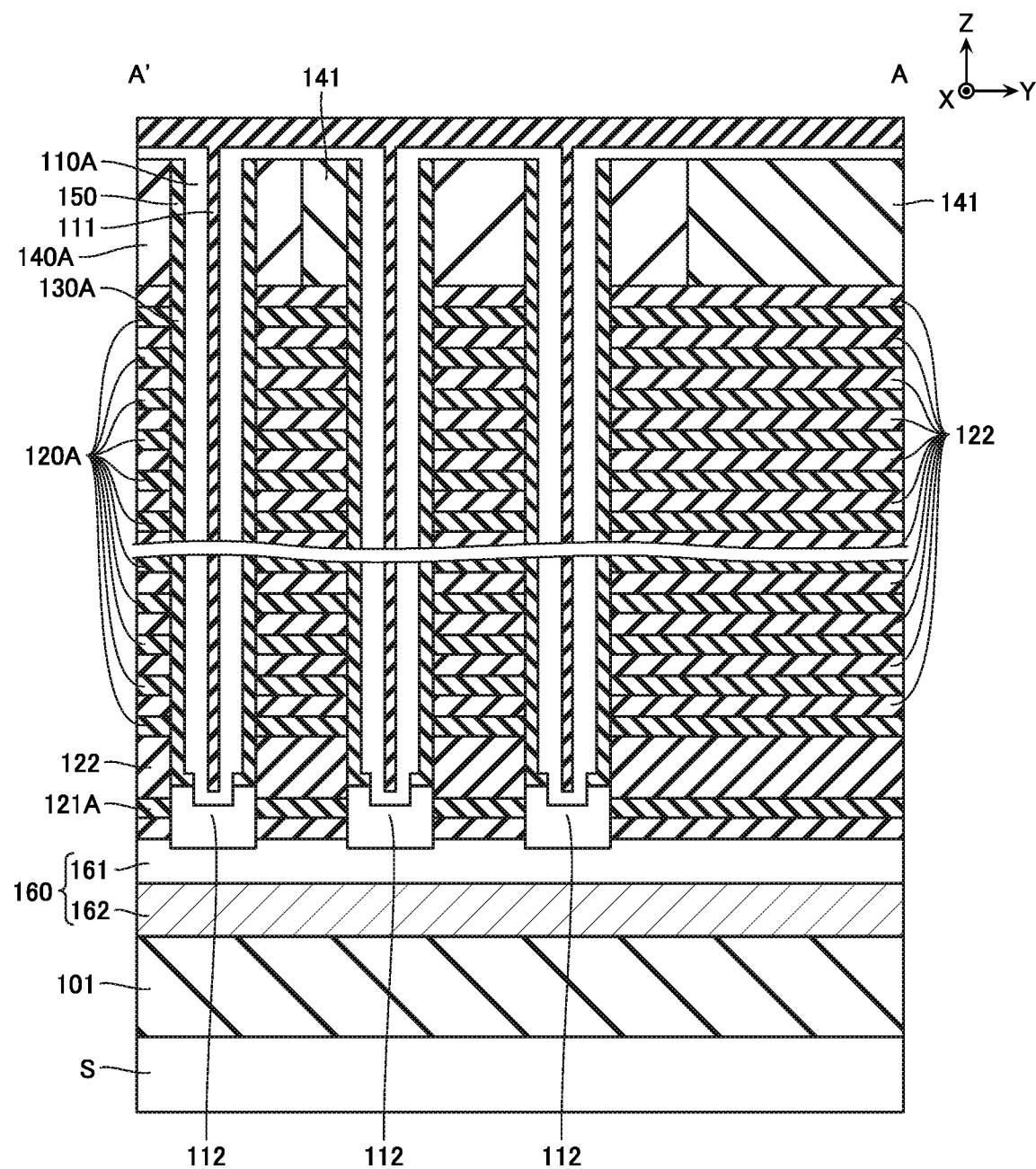
FIG. 19 is a schematic cross-sectional view illustrating the same manufacturing method.

Next, as illustrated in FIG. 19, the amorphous silicon layer 110A and the insulating layer 111 are deposited on the upper surface of the semiconductor layer 112 and the inner peripheral surface of the amorphous silicon layer 110A. This process is performed by CVD and the like, for example.

Figure 20:
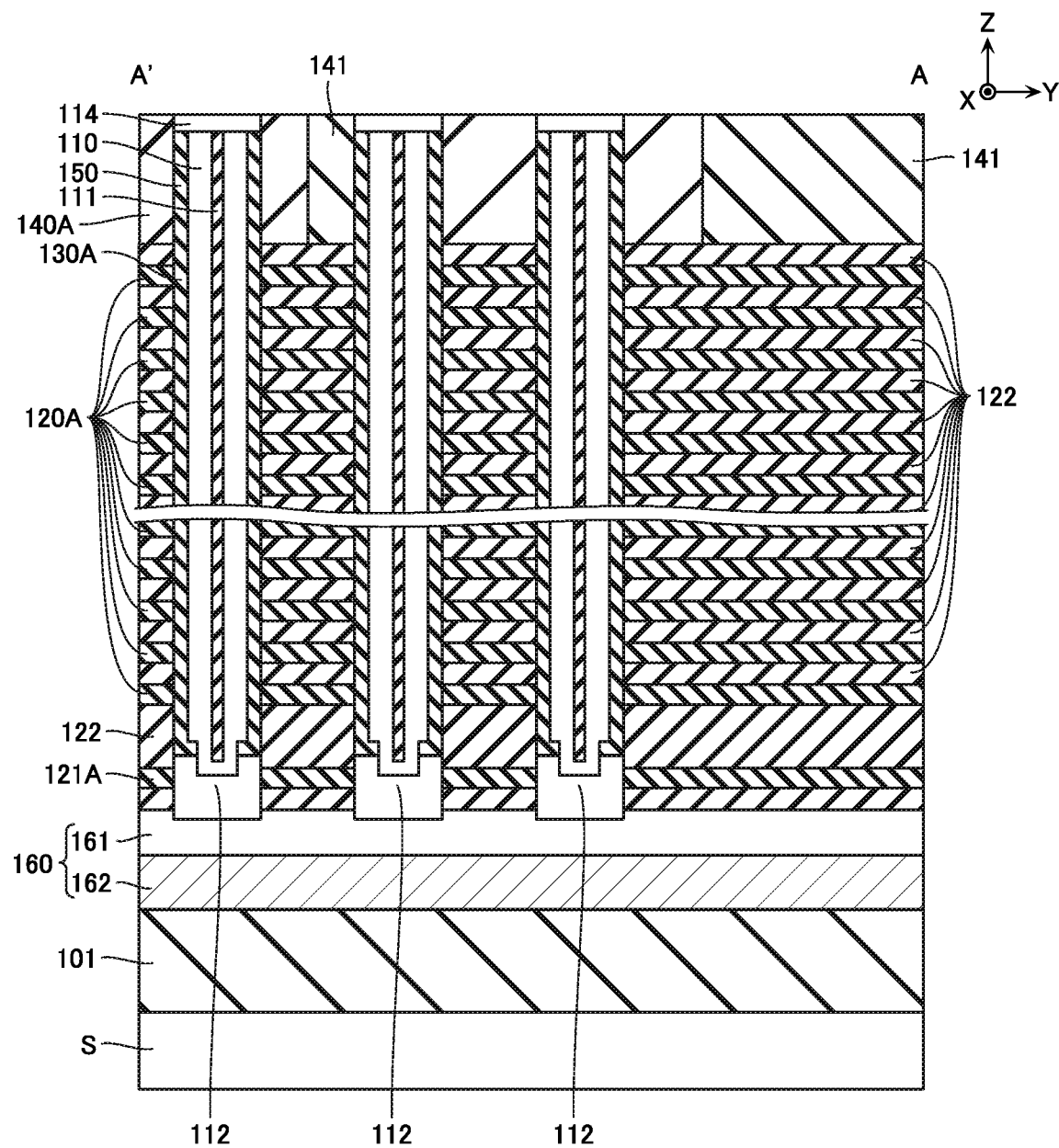
FIG. 20 is a schematic cross-sectional view illustrating the same manufacturing method.
Figure 21:
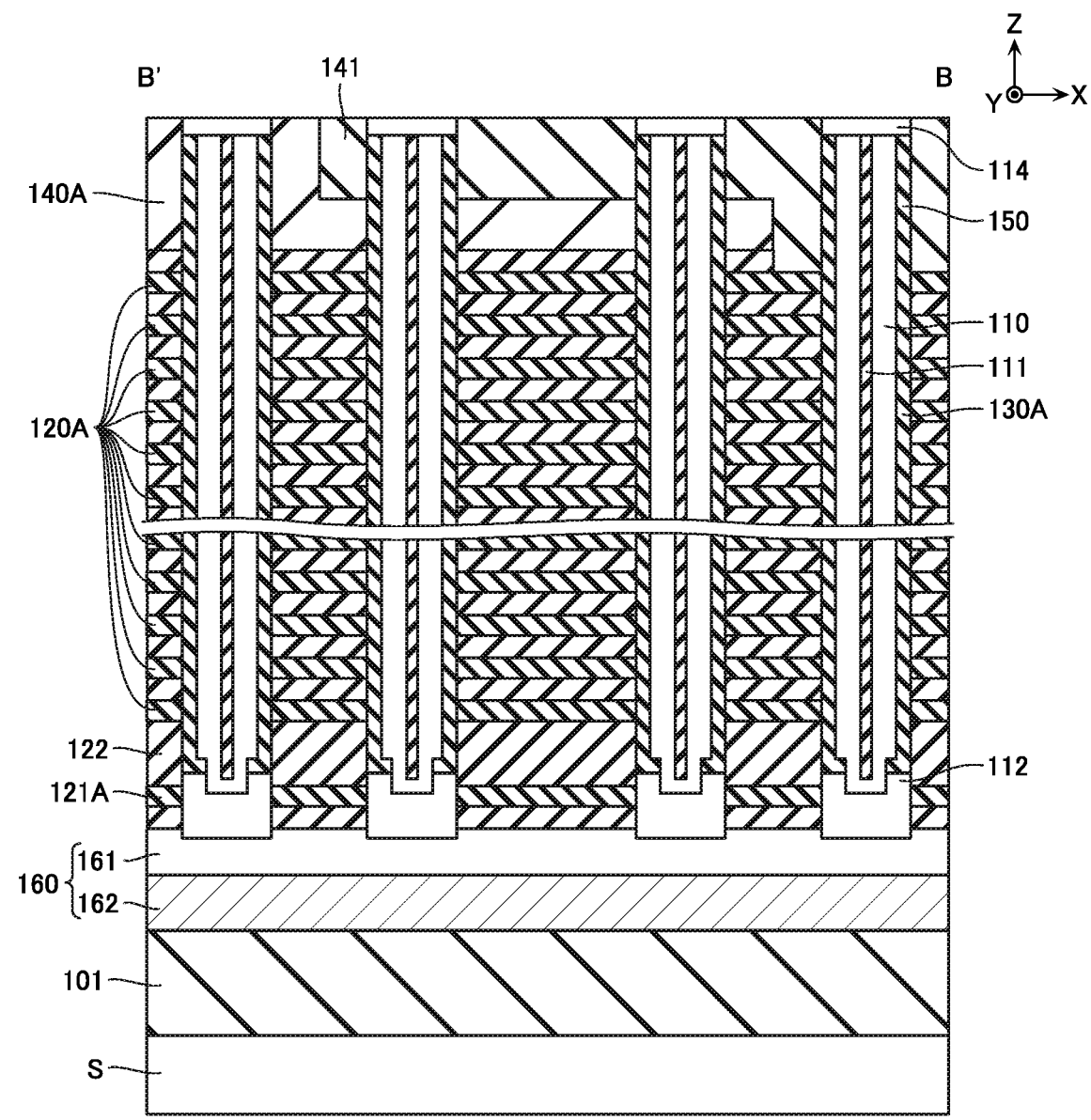
FIG. 21 is a schematic cross-sectional view illustrating the same manufacturing method.

Next, as illustrated in FIG. 20 and FIG. 21, the semiconductor layer 110 is formed from the amorphous silicon layer 110A, the semiconductor layer 110 and the insulating layer 111 are partially removed, and the semiconductor layer 114 is formed. The semiconductor layer 110 is formed by reforming the crystal structure of the amorphous silicon layer 110A by a method such as annealing, for example. The semiconductor layer 110 and the like are partially removed by a method such as RIE, for example. The semiconductor layer 114 is formed by methods such as CVD and RIE, for example.

Figure 22:
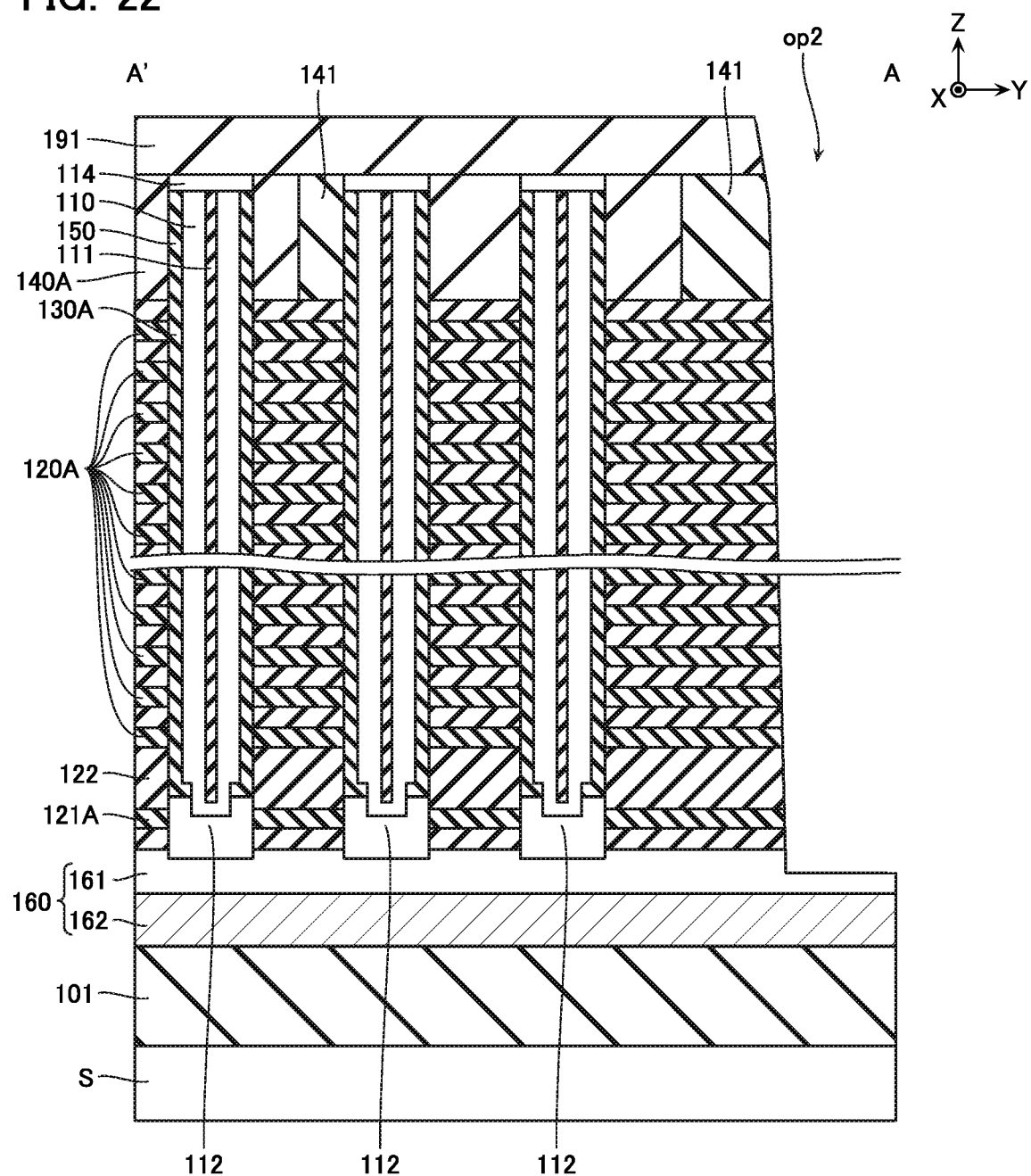
FIG. 22 is a schematic cross-sectional view illustrating the same manufacturing method.

Next, as illustrated in FIG. 22, an opening op2 is formed. The opening op2 is a groove that extends in the Z direction and the X direction, separates the insulating layers 141, the insulating layers 122, and the sacrificing layers 120A in the Y direction, and exposes the upper surface of the semiconductor layer 161. In this process, an insulating layer 191 of silicon oxide ($SiO_2$) and the like is formed on the upper surface of the structure illustrated in FIG. 20 by a method such as CVD, for example. Next, a groove extending in the X direction is formed in a part of the insulating layer 191 corresponding to the opening op2 by a method such as wet etching. Next, RIE and the like are performed by using the insulating layer 191 as a mask. As a result, the opening op2 is formed.

Figure 23:
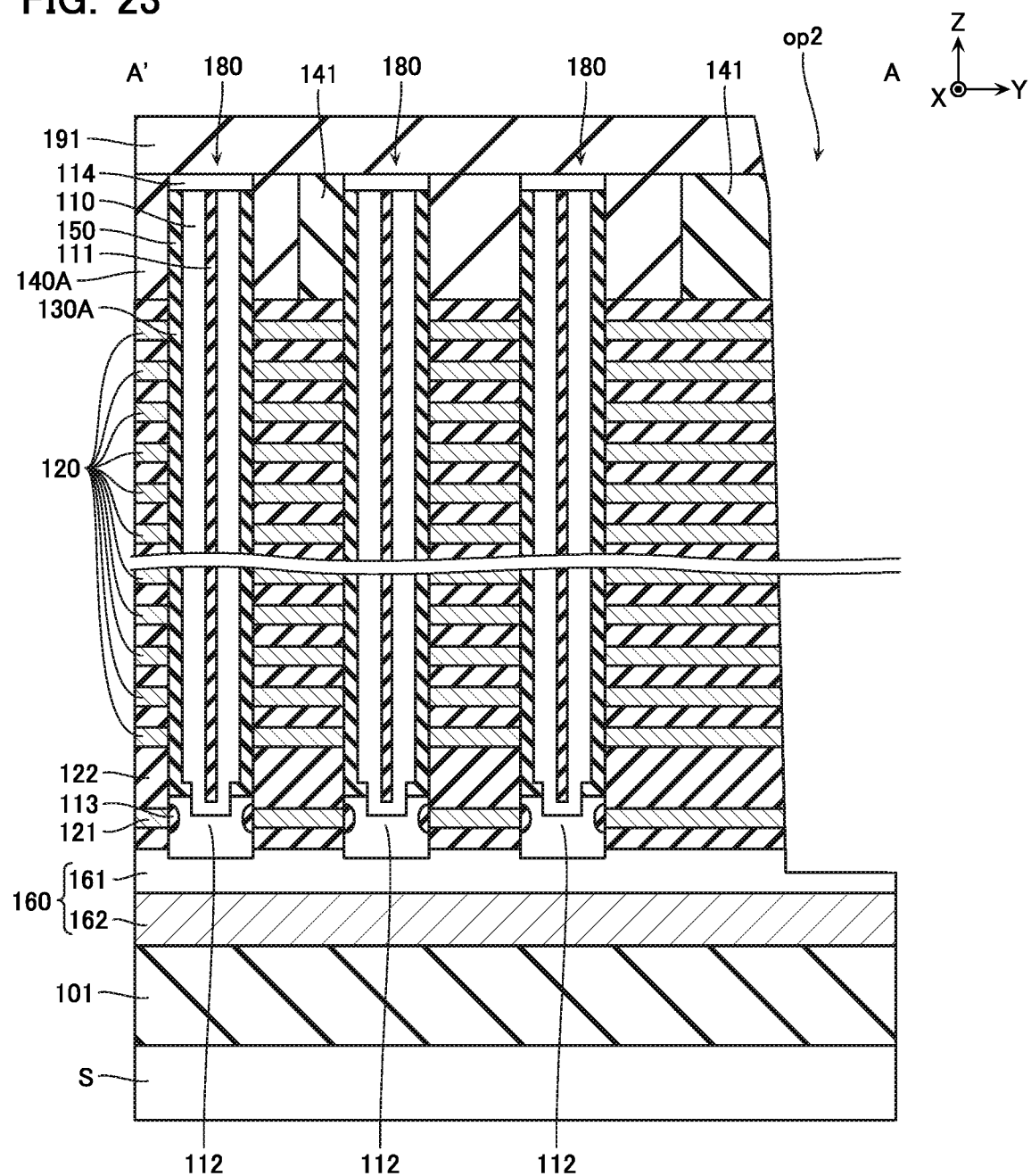
FIG. 23 is a schematic cross-sectional view illustrating the same manufacturing method.
Figure 24:
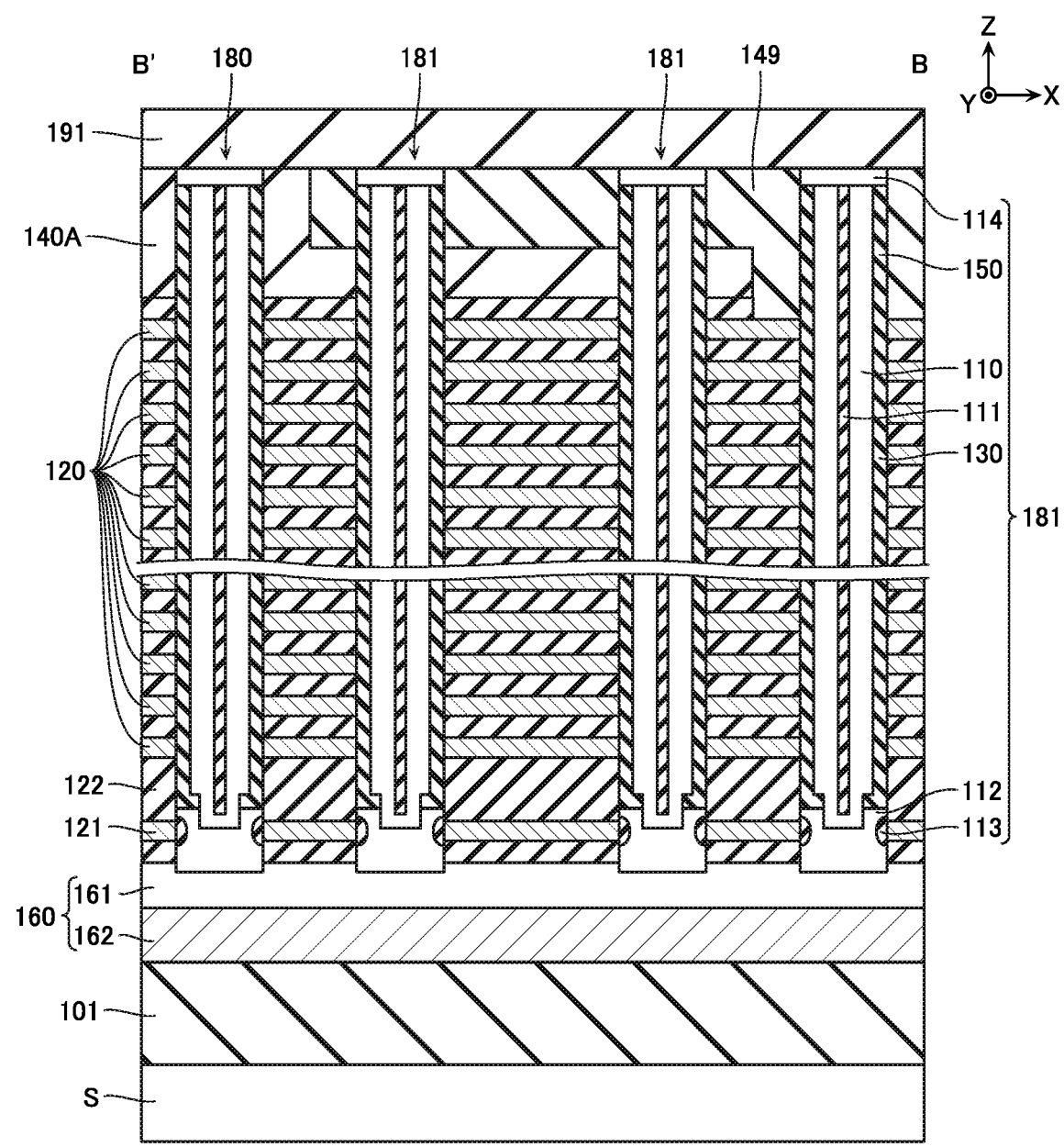
FIG. 24 is a schematic cross-sectional view illustrating the same manufacturing method.

Next, as illustrated in FIG. 23 and FIG. 24, the memory structures 180, the dummy structures 181, and the conductive layers 120 are formed. In this process, for example, wet etching and the like using phosphoric acid are performed via the opening op2 (FIG. 23), and the sacrificing layers 120A are removed. Next, oxidation treatment and the like are performed on the side surface of the semiconductor layer 112 via the opening op2, and the gate insulating film 113 is formed. Next, the high dielectric insulating film 134 (FIG. 5) and the conductive layer 120 are deposited on side surfaces of the laminated film 130A, and upper surfaces, lower surfaces, and side surfaces of the insulating layers 122 by CVD and the like via the opening op2. Next, by wet etching and the like, the conductive layer 120 is partially removed and the conductive layer 120 is separated in the Z direction.

Figure 25:
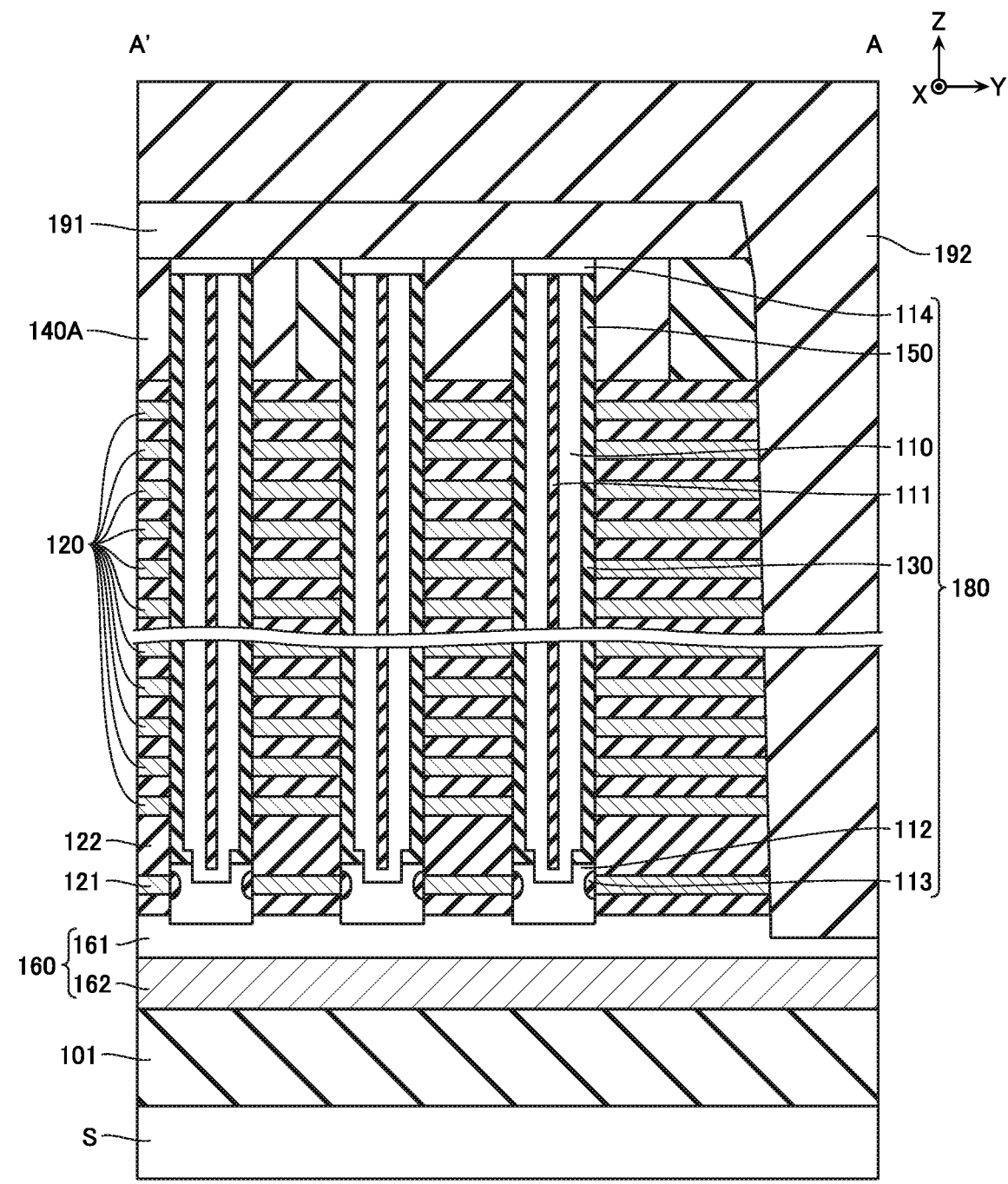
FIG. 25 is a schematic cross-sectional view illustrating the same manufacturing method.

Next, as illustrated in FIG. 25, an insulating layer 192 of silicon oxide ($SiO_2$) is formed in the opening op2. This process is performed by a method such as CVD, for example.

Figure 26:
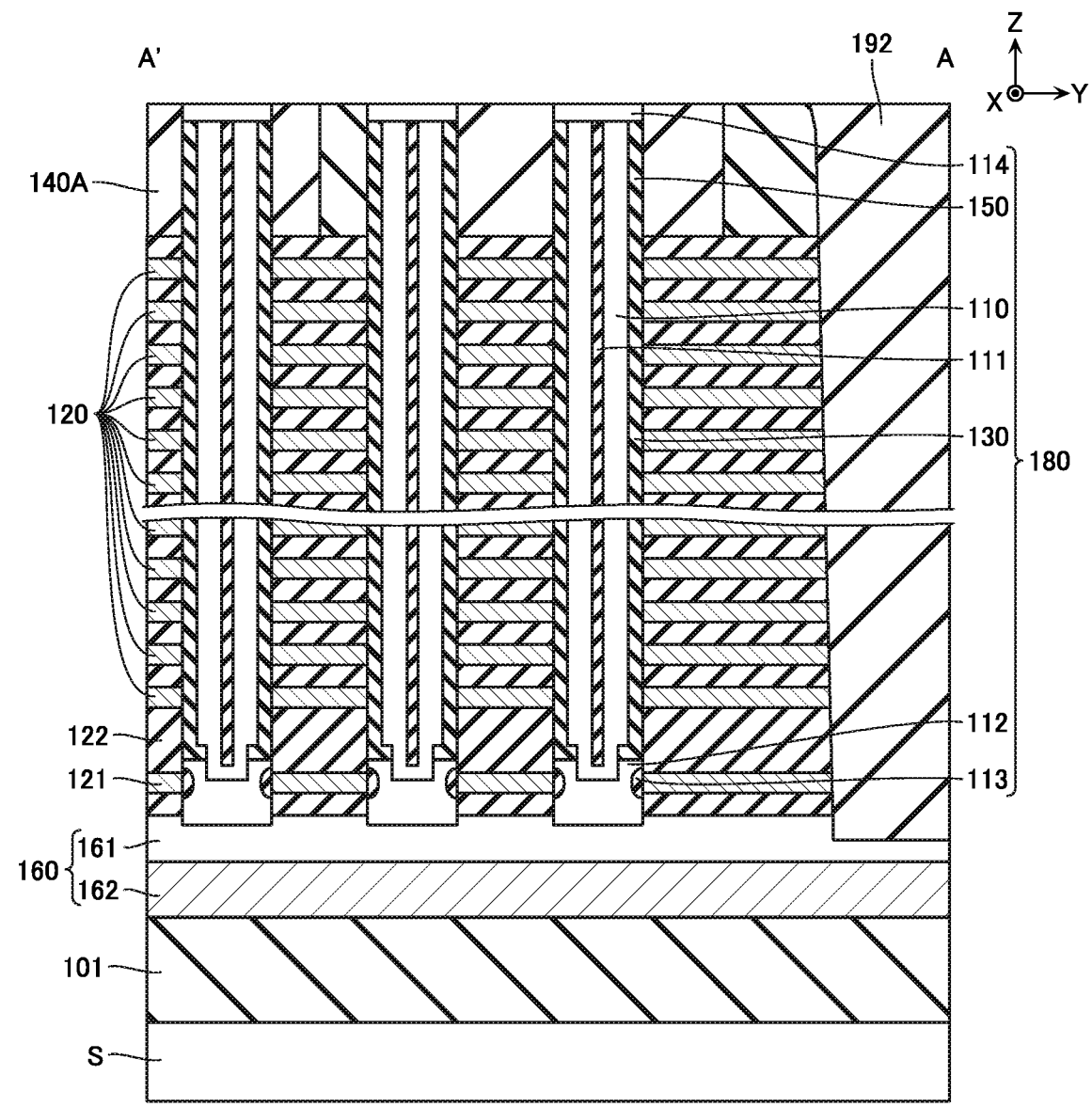
FIG. 26 is a schematic cross-sectional view illustrating the same manufacturing method.

Next, as illustrated in FIG. 26, the insulating layer 192 is partially removed and the upper surface of the sacrificing layer 140A is exposed. This process is performed by a method such as etch backing by RIE, for example.

Figure 27:
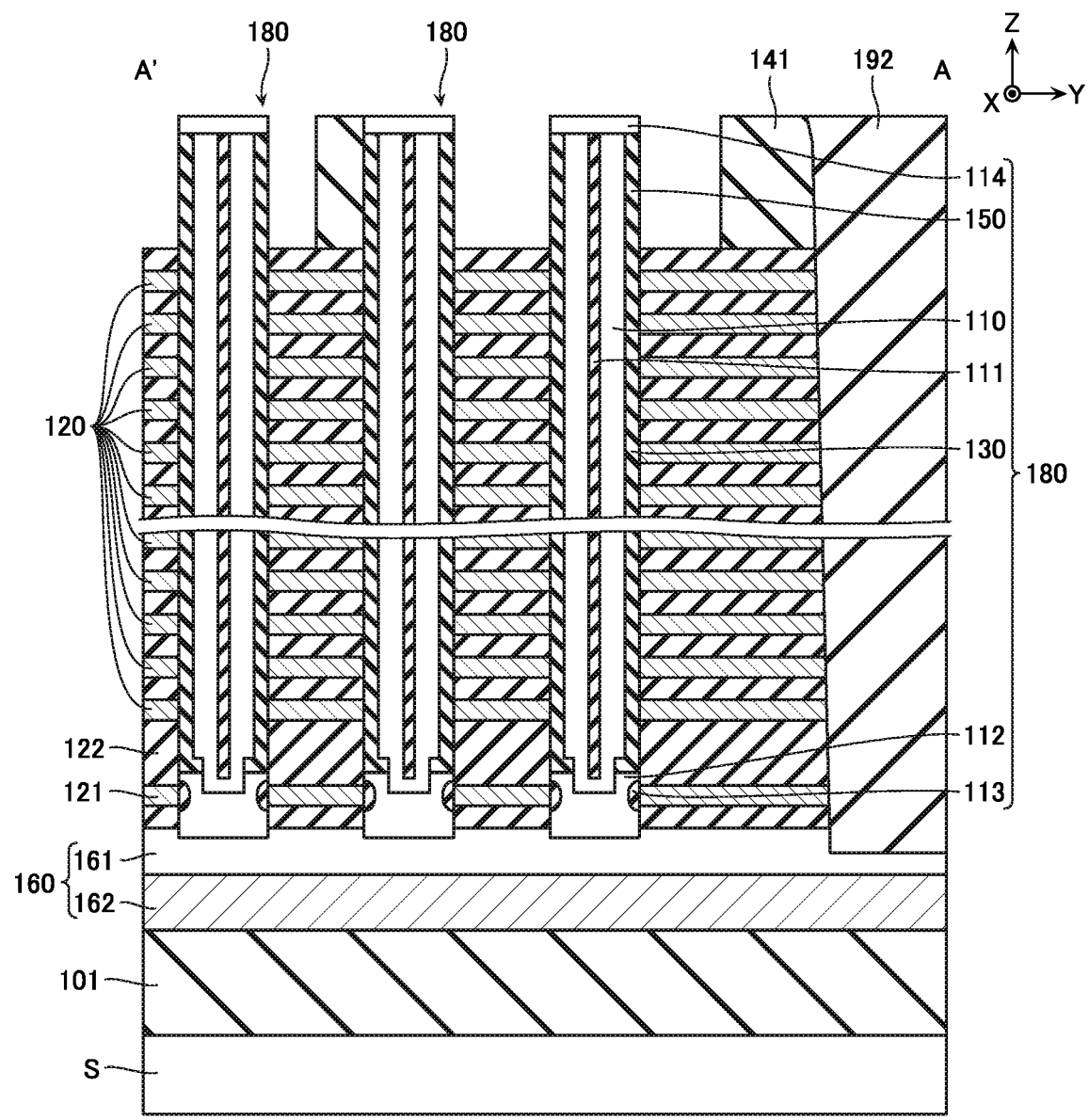
FIG. 27 is a schematic cross-sectional view illustrating the same manufacturing method.
Figure 28:
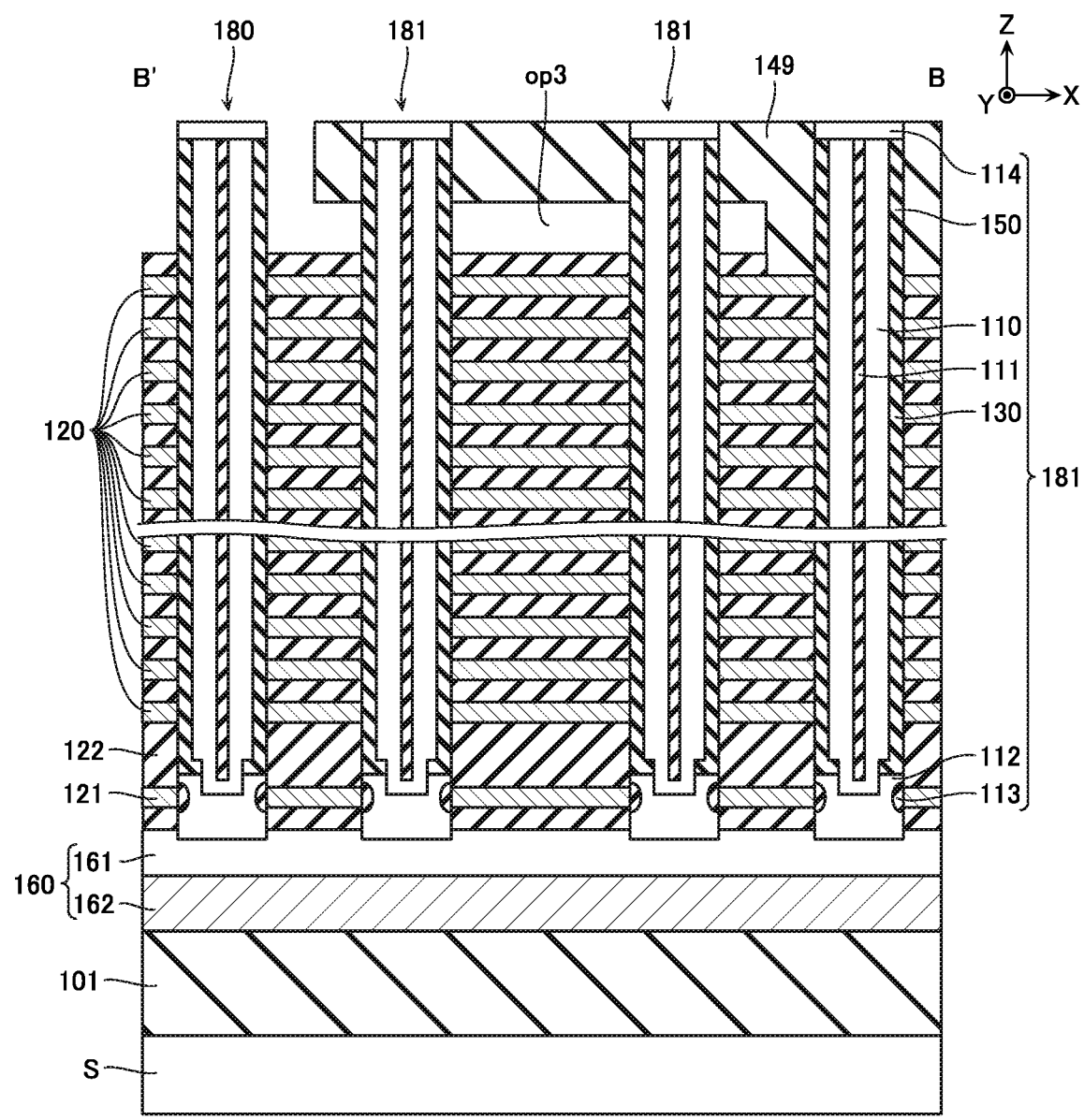
FIG. 28 is a schematic cross-sectional view illustrating the same manufacturing method.

Next, as illustrated in FIG. 27 and FIG. 28, the sacrificing layer 140A is removed. This process is performed by wet etching and the like using phosphoric acid, for example. In this process, the parts that had been in contact with the sacrificing layer 140A of the outer peripheral surfaces of the memory structure 180 and the dummy structure 181 near the upper ends thereof are exposed. Further, as illustrated in FIG. 28, an opening op3 is formed in a part in which the end portion of the sacrificing layer 140A in the X direction had been located. A bottom surface of the opening op3 is the upper surface of the insulating layer 122, a side surface of the opening op3 in the X direction is a side surface of the insulating layer 149 in the X direction, and an upper surface of the opening op3 is a lower surface of the insulating layer 149, and the opening op3 communicates with the outside.

Figure 29:
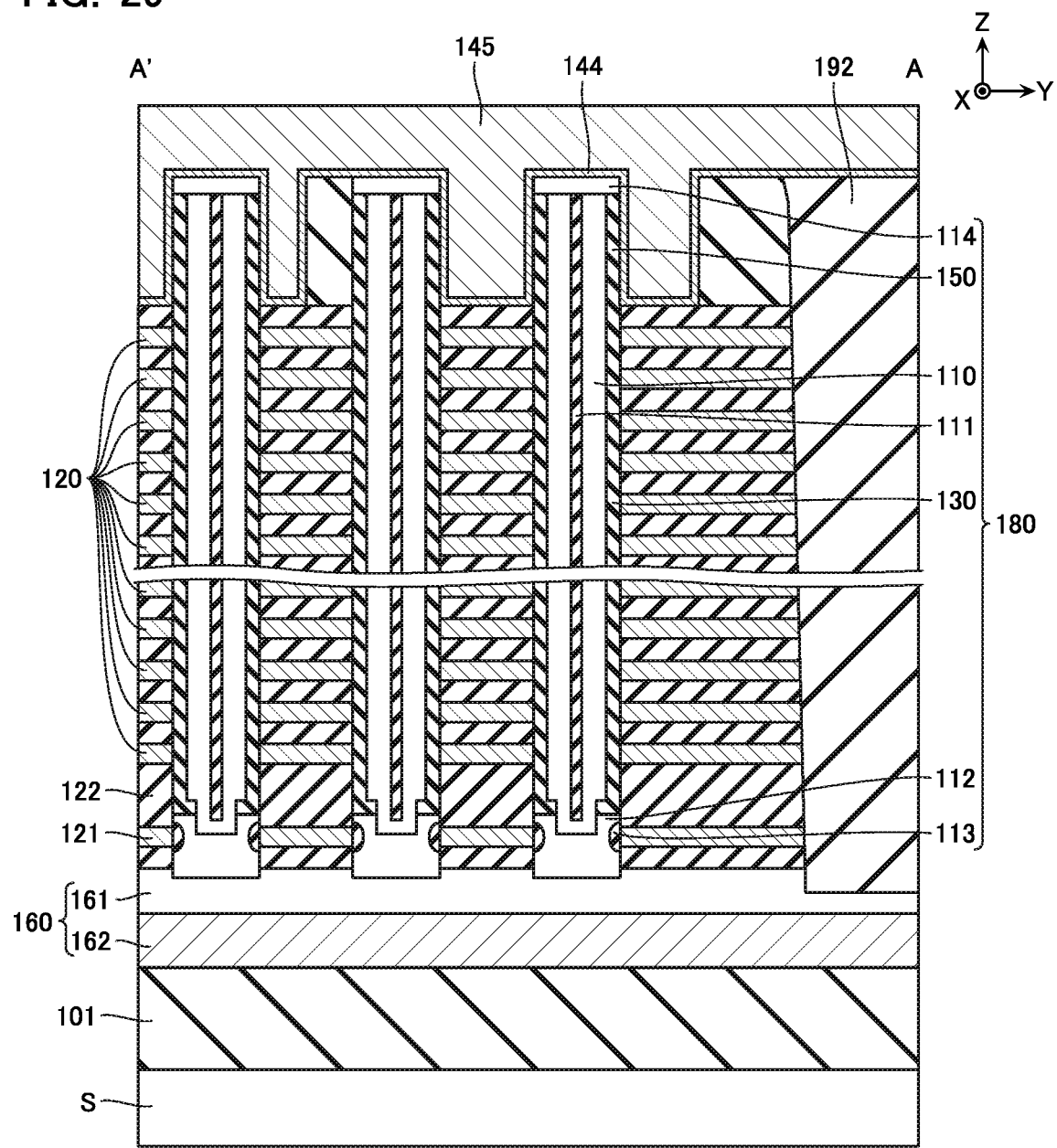
FIG. 29 is a schematic cross-sectional view illustrating the same manufacturing method.
Figure 30:
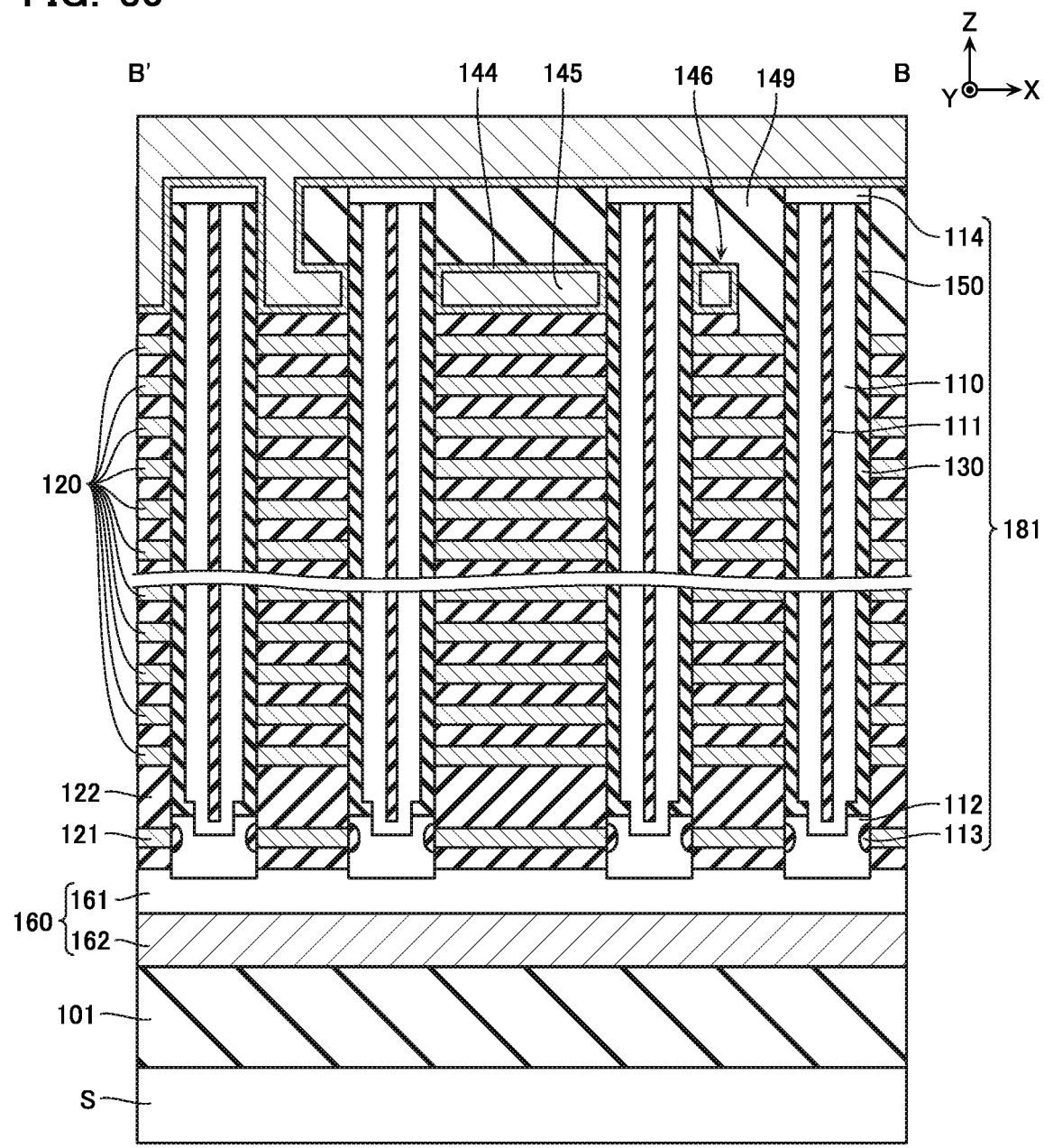
FIG. 30 is a schematic cross-sectional view illustrating the same manufacturing method.

Next, as illustrated in FIG. 29 and FIG. 30, the barrier metal film 144 and the metal film 145 are deposited on the upper surface of the insulating layer 122, the outer peripheral surfaces of the memory structure 180 and the dummy structure 181 near the upper ends thereof, and the opening op3. This process is performed by CVD and the like, for example.

Figure 31:
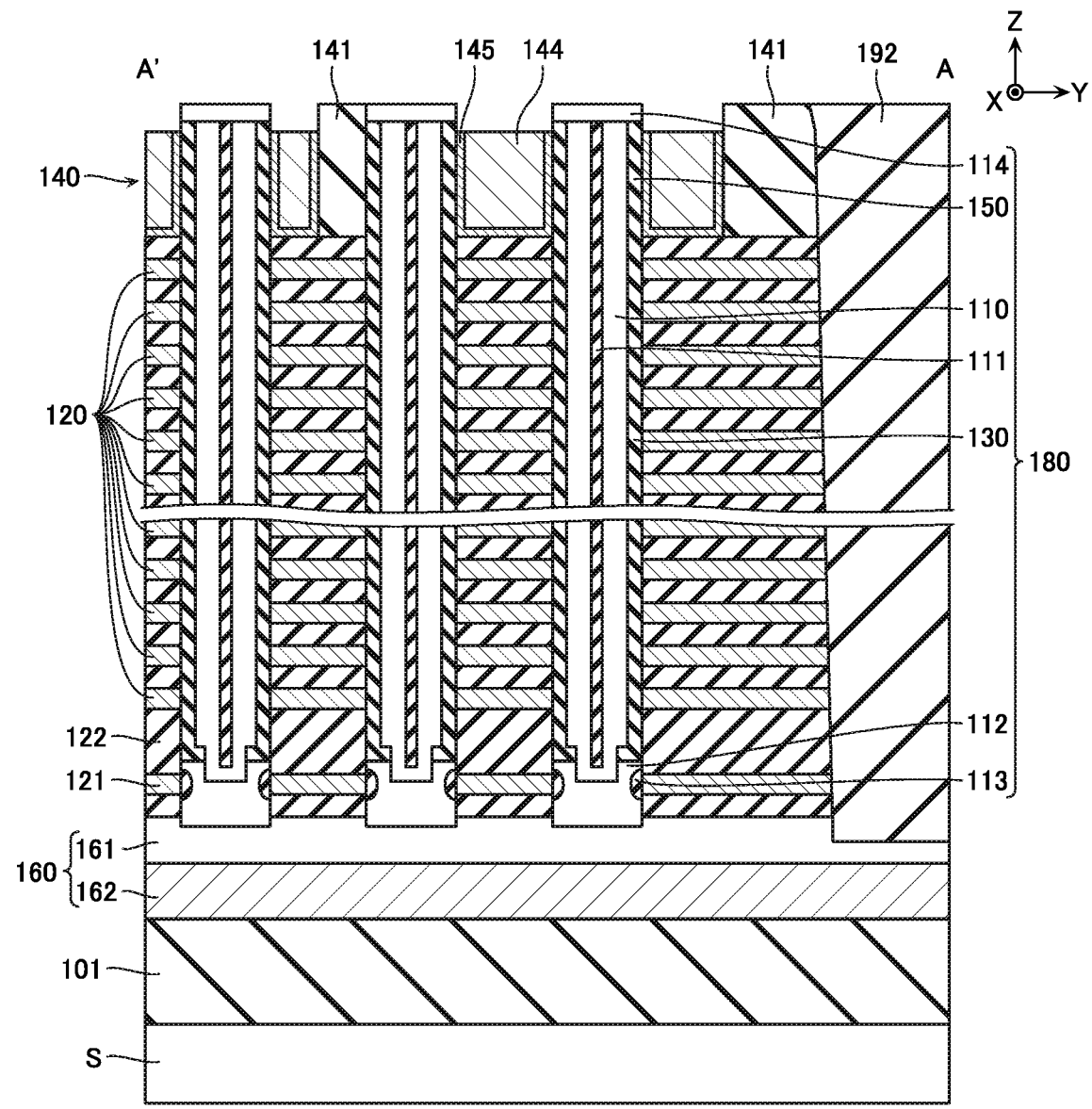
FIG. 31 is a schematic cross-sectional view illustrating the same manufacturing method.
Figure 32:
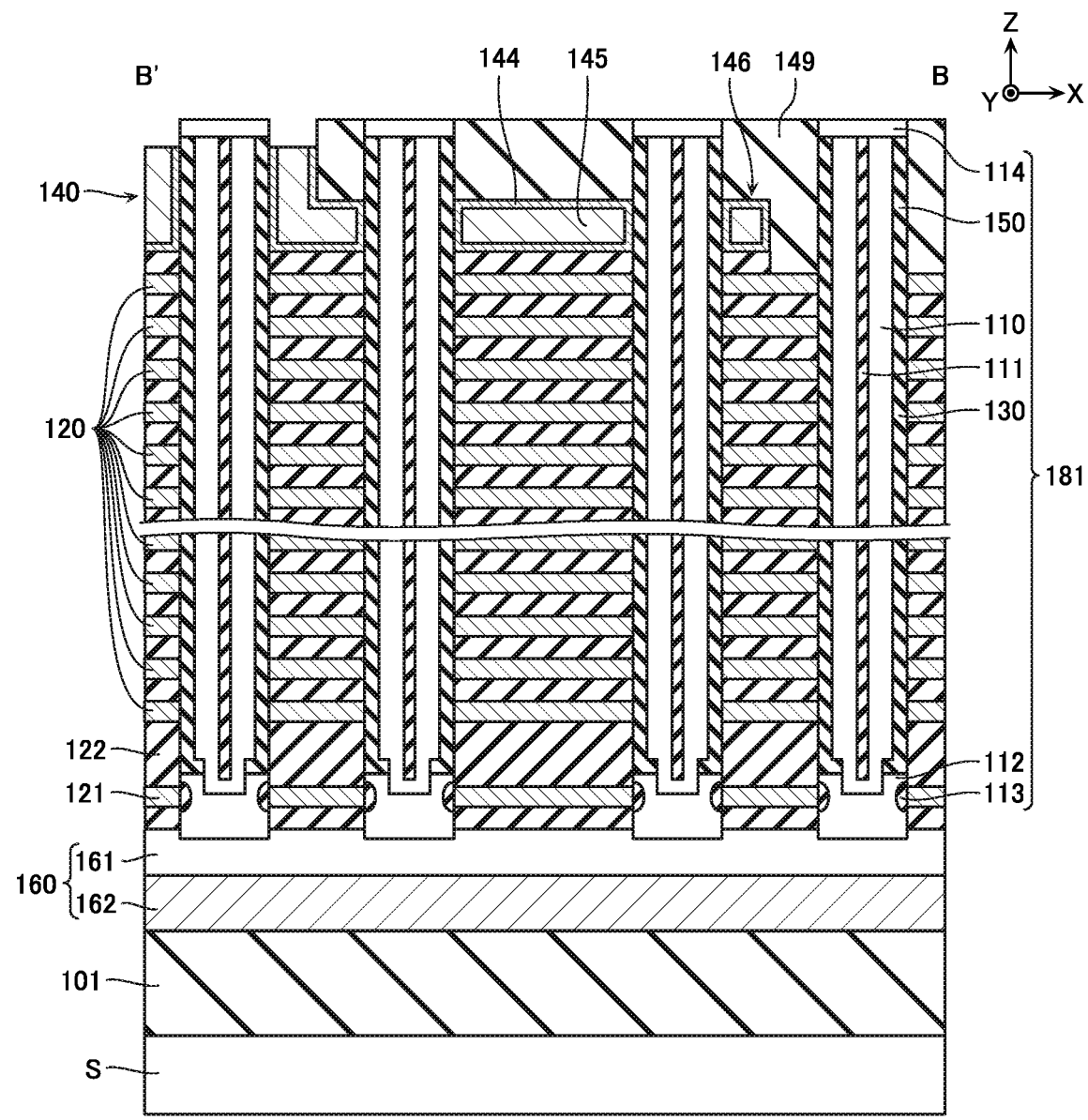
FIG. 32 is a schematic cross-sectional view illustrating the same manufacturing method.

Next, as illustrated in FIG. 31 and FIG. 32, a part of the barrier metal film 144 and the metal film 145 is removed, and the conductive layer 140 is formed. This process is performed by etching and the like, for example. The etching is performed under the condition in which the removal of the barrier metal film 144 and the metal film 145 is easier than the removal of the insulating layers 141 and 149, for example. In this process, the barrier metal film 144 and the metal film 145 are separated in the X direction.

Figure 33:
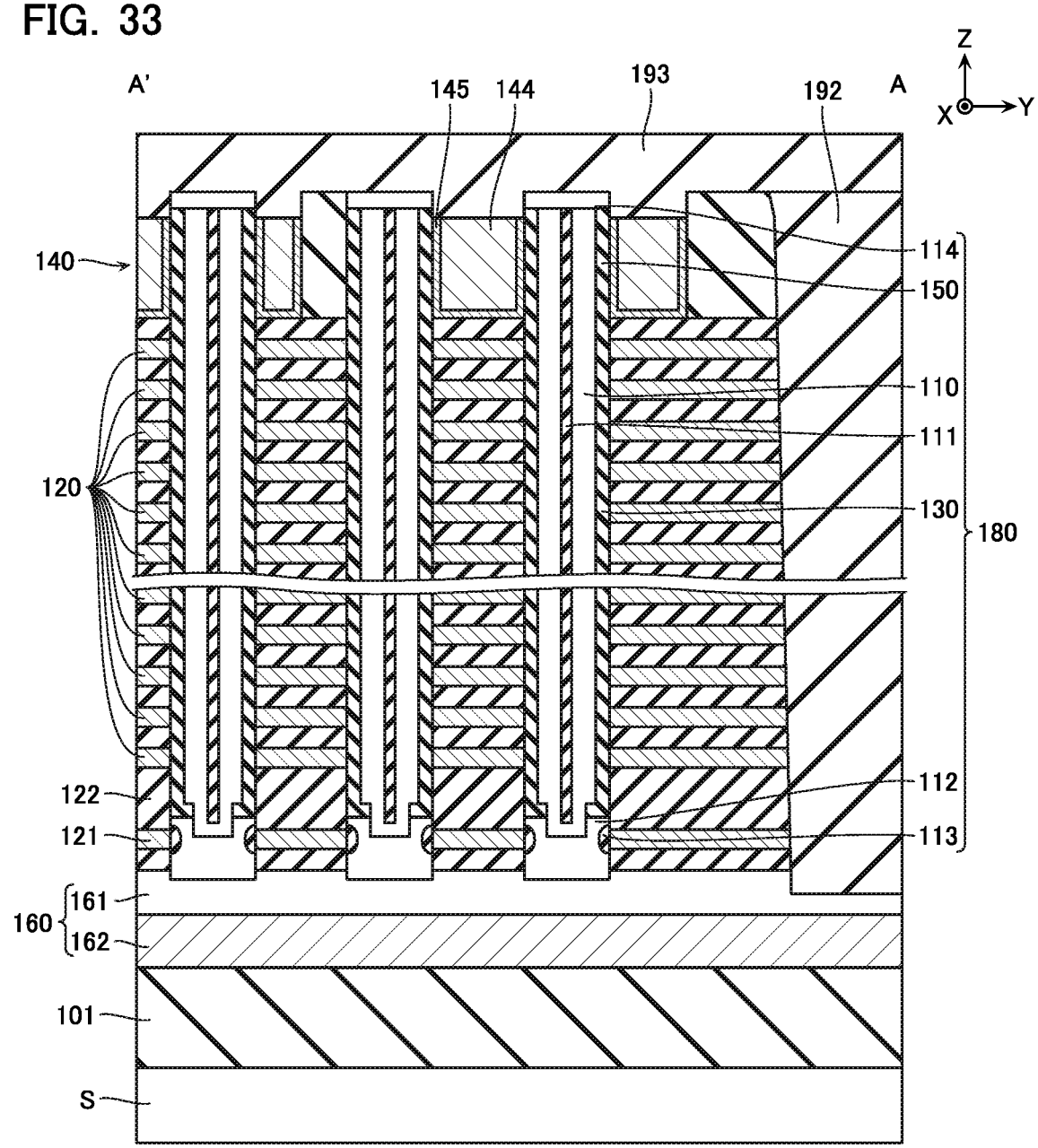
FIG. 33 is a schematic cross-sectional view illustrating the same manufacturing method.
Figure 34:
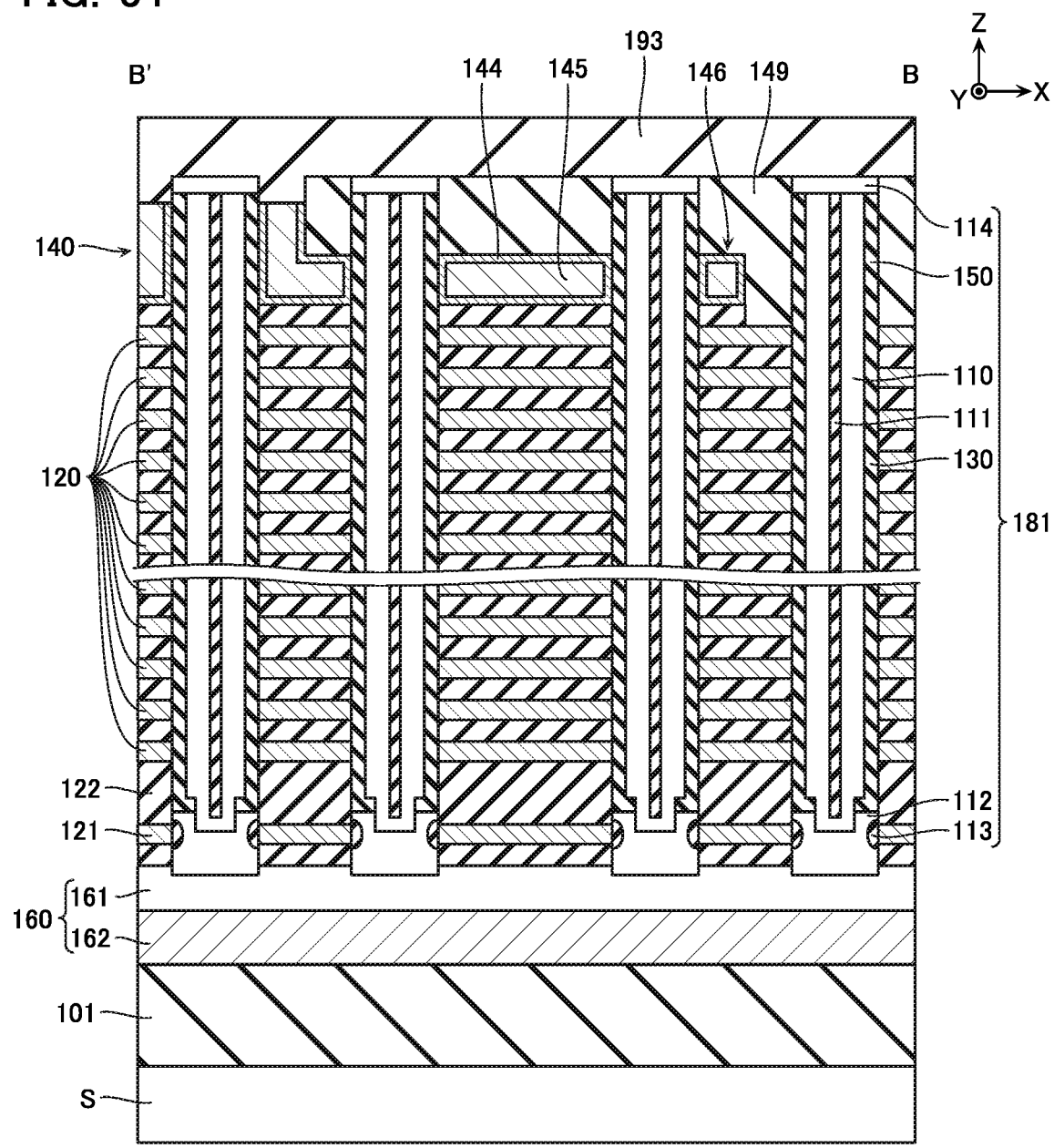
FIG. 34 is a schematic cross-sectional view illustrating the same manufacturing method.

Next, as illustrated in FIG. 33 and FIG. 34, an insulating layer 193 of silicon oxide ($SiO_2$) and the like is formed on the upper surface of the conductive layer 140. This process is performed by a method such as CVD, for example.

Next, the semiconductor memory device described with reference to FIG. 3 to FIG. 8 is manufactured by forming the contacts 124, 147, and 171, the wiring 170, and other wiring and the like.

[Effect]

Figure 35:
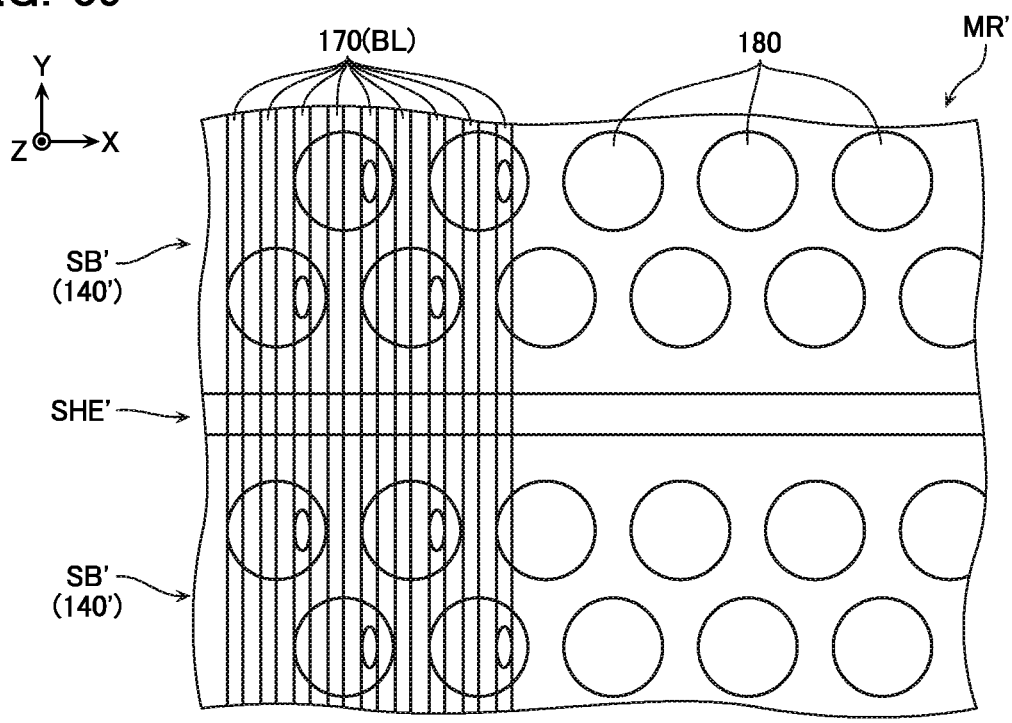
FIG. 35 is a schematic plan view of a semiconductor memory device according to a first comparative example.

FIG. 35 is a schematic plan view illustrating the configuration of a memory region MR' of a semiconductor memory device according to a first comparative example. In the memory region MR', the memory structures 180 are not provided near a subblock separation structure SHE'. That is, the memory structures 180 are not placed in a uniform pattern regardless of the place of a conductive layer 140'.

Figure 36:
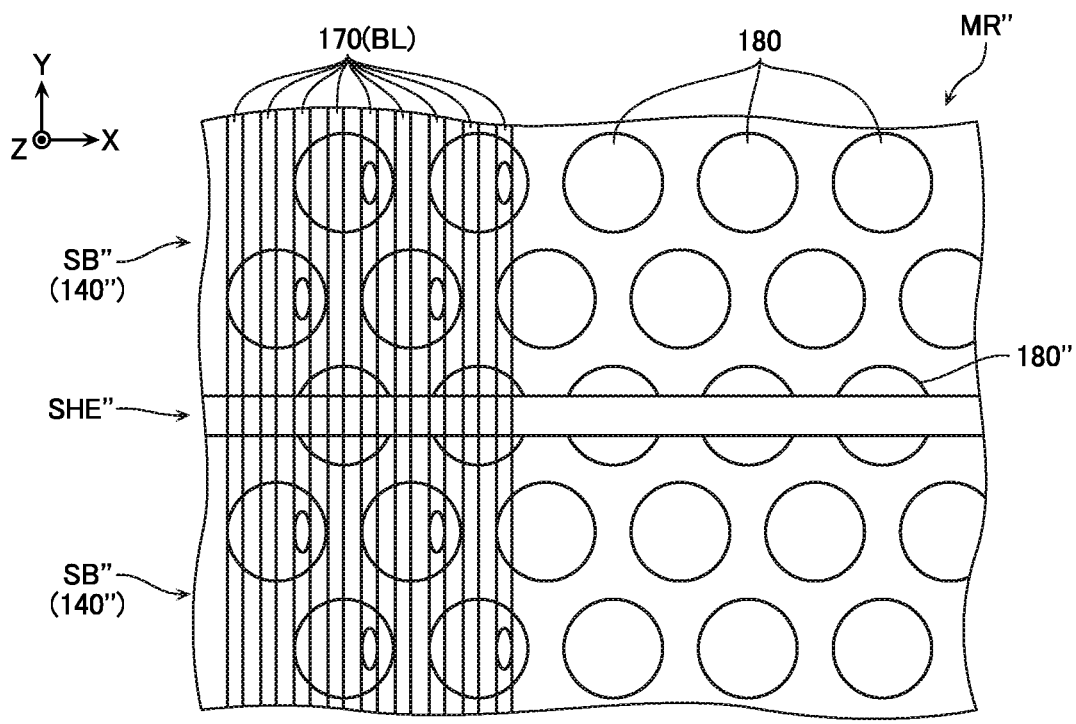
FIG. 36 is a schematic plan view of a semiconductor memory device according to a second comparative example.

FIG. 36 is a schematic plan view illustrating the configuration of a memory region MR" of a semiconductor memory device according to the second comparative example. The second comparative example is substantially similar to the first comparative example, and structures 180" having a structure similar to the memory structures 180 are provided near a subblock separation structure SHE". Further, when the memory structures 180 and the structures 180" are combined, a uniform pattern is obtained regardless of the place of a conductive layer 140". However, the structures 180" are not connected to the bit line BL and the like, and are not used as the memory string MS (FIG. 1).

Now, as described with reference to FIG. 7A, in this embodiment, the plurality of memory structures 180 are placed in a uniform pattern regardless of the layout of the conductive layer 140. According to such a configuration, the number of the memory structures 180 per unit area in the memory region MR can be increased, the storage capacity can be increased, and a semiconductor memory device that can be highly integrated in an easy manner can be provided.

When such a configuration is employed, out of the first memory structure 180a, the second memory structure 180b, and the third memory structure 180c as described with reference to FIG. 7A, the outer peripheral surfaces of the first memory structure 180a and the second memory structure 180b may be covered with the first conductive layer 140a and the outer peripheral surface of the third memory structure 180c may be covered with the second conductive layer 140b.

Now, for certain reasons relating to the manufacture process, to a break down voltage and the like, it may be preferred that a certain distance be provided between the conductive layers 140. Thus, in this embodiment, a certain distance is provided between the conductive layers 140 adjacent to each other in the Y direction regardless of the places of the memory structures 180.

When such a structure is employed, as exemplified in FIG. 7A and the like, the memory structure 180 placed near the side surface of the conductive layer 140 in the Y direction may stick out from the side surface of the conductive layer 140 in the Y direction. There are cases where the entire outer peripheral surface of such a memory structure 180 is not surrounded by the through hole in the conductive layer 140, and only a part of the outer peripheral surface is opposed to the recessed portion formed in the side surface of the conductive layer 140 in the Y direction.

Further, when such a structure is employed, the threshold voltage and the like of the drain select transistor STD may be different between the memory structure 180 of which entire outer peripheral surface is surrounded by the conductive layer 140, and the memory structure 180 of which outer peripheral surface is surrounded by the conductive layer 140 and the insulating layer 141. Thus, in this embodiment, a recessed portion opposed to the memory structure 180 is also formed in the side surface of the conductive layer 140, which is located on the end portion of the memory block MB in the Y direction, on the block separation structure ST side.

When the semiconductor memory device having such a structure is manufactured, the following configuration can be conceived, for example. That is, the sacrificing layer 140A (FIG. 10) corresponding to the conductive layer 140 is formed. Then, the memory structures 180 are formed, and the sacrificing layer 140A is separated in the Y direction thereafter. However, in this embodiment, a structure in which some of the memory structures 180 are sticking out from the side surface of the conductive layer 140 in the Y direction is employed. Therefore, when the sacrificing layer 140A is separated after the memory structures 180 are formed, it is conceivable that the memory structures 180 are partially exposed to gas due to the etching and the like and become destroyed. Thus, in this embodiment, the memory structures 180 are formed after the sacrificing layer 140A is separated. As a result, destruction of the memory structures 180 can be suppressed.

Now, when such a method is employed, in the process illustrated in FIG. 22, for example, the sacrificing layer 140A is already separated in the Y direction. Therefore, the side surfaces of all of the sacrificing layers 140A in the Y direction cannot be exposed to the opening op2. Therefore, the removal of the sacrificing layer 140A and the deposition of the conductive layer 140 cannot be performed via the opening op2. Thus, in this embodiment, the sacrificing layers 140A are removed from the upper surface of the structure illustrated in FIG. 26 (FIG. 27 and FIG. 28), and the conductive layer 140 is deposited from above (FIG. 29 and FIG. 30). When such a method is employed, as described with reference to FIG. 4, there are cases where the barrier metal film 144 is formed on the lower surface and the side surfaces of the conductive layer 140 and the barrier metal film 144 is not formed on the upper surface of the conductive layer 140.

Figure 37:
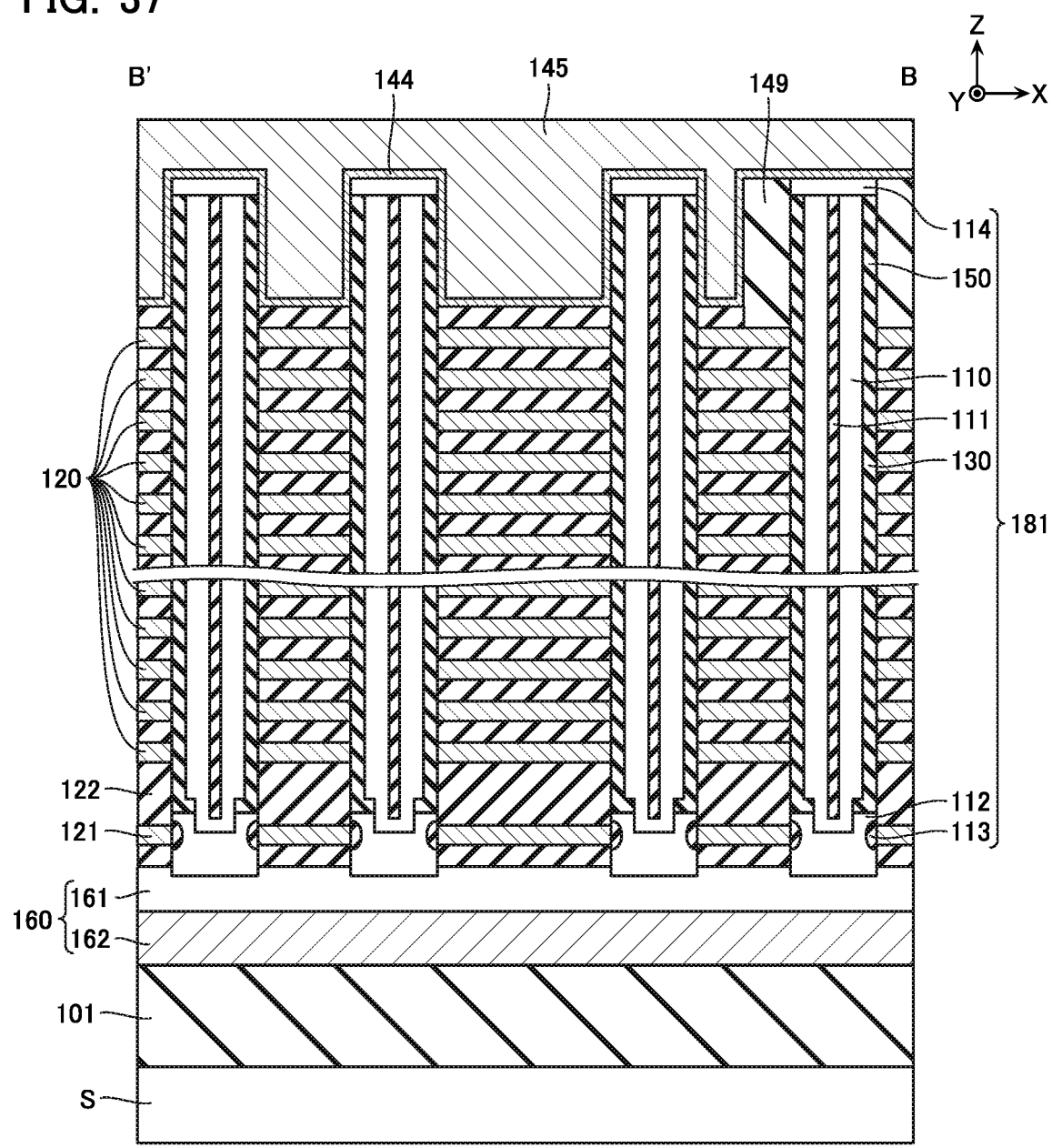
FIG. 37 is a schematic cross-sectional view illustrating a manufacturing method according to a comparative example.
Figure 38:
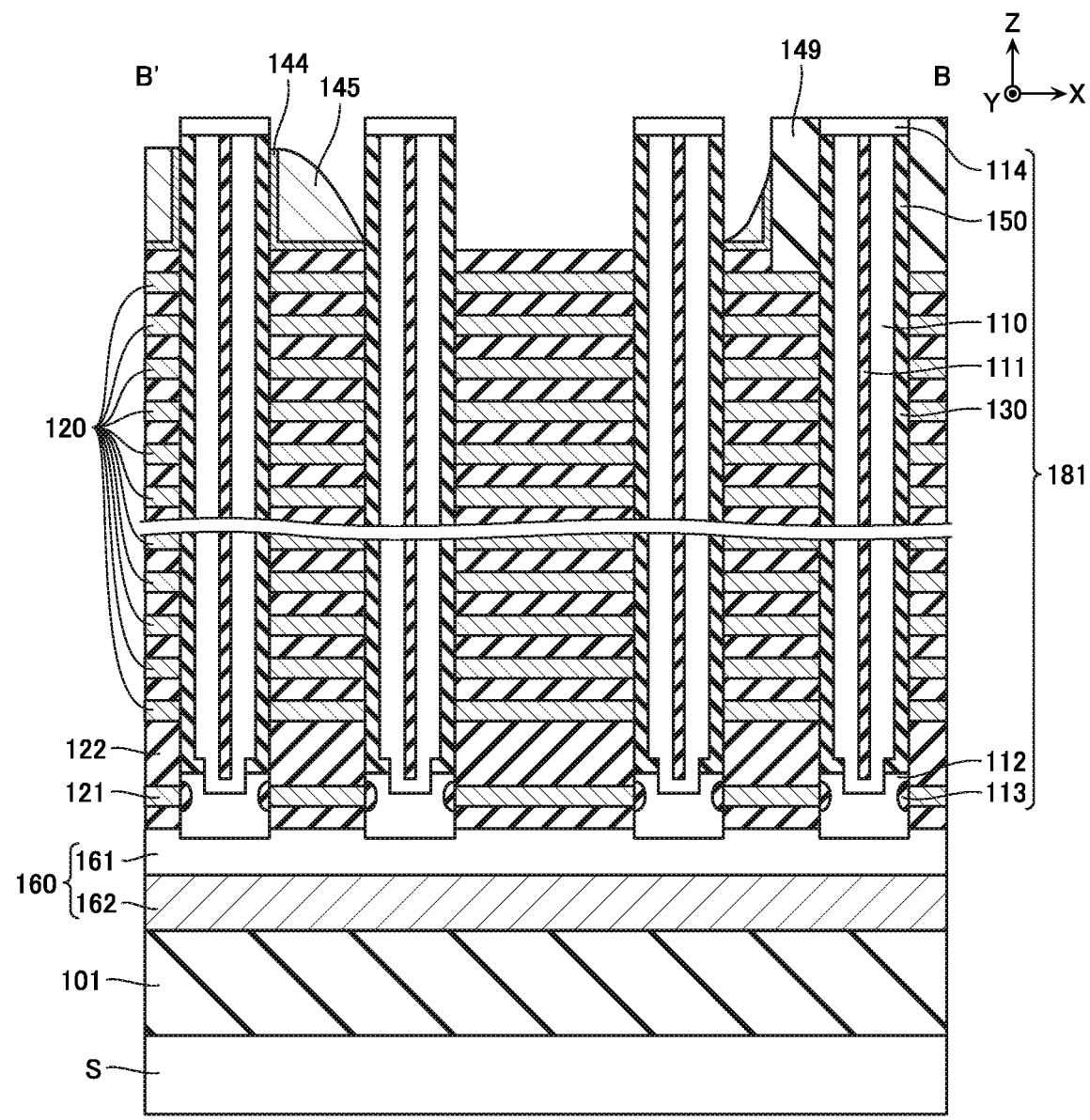
FIG. 38 is a schematic cross-sectional view illustrating the same manufacturing method.

Further, in this embodiment, in the process illustrated in FIG. 31 and FIG. 32, the barrier metal film 144 and the metal film 145 are partially removed. In this process, as illustrated in FIG. 32, the upper surface of the part of the conductive layer 140 that becomes the contact portion 146 is covered with the insulating layer 149. Now, if the upper surface of the part that becomes the contact portion 146 is not covered as illustrated in FIG. 37, it is conceivable that the part that corresponds to the contact portion 146 out of the barrier metal film 144 and the metal film 145 is completely removed and the contact portion 146 cannot be formed as illustrated in FIG. 38. This is because, as illustrated in FIG. 7A, the density of the dummy structure 181 in the contact region CR is lower than the density of the memory structure 180 in the memory region MR, and it is conceivable that a difference is caused in the rate of the etching and the like. Note that, when such a method is employed, as described with reference to FIG. 3, the thickness W2 of the contact portion 146 in the Z direction may become thinner than the thickness W1 of the part opposed to the semiconductor layer 110 in the Z direction.

Further, in this embodiment, the deposition of the conductive layer 120 (FIG. 23) and the deposition of the conductive layer 140 (FIG. 29 and FIG. 30) are performed by different processes. Therefore, one of the conductive layer 120 and the conductive layer 140 may include a material and the like that are not included in the other. Similarly, one of the gate insulating film 130 and the gate insulating film 150 may include a material and the like that are not included in the other. For example, in this embodiment, while the gate insulating film 130 includes the high dielectric insulating film 134 (FIG. 5), the gate insulating film 150 does not include the high dielectric insulating film 134 (FIG. 6).

Other Embodiments

As described with reference to FIG. 7A, in the first embodiment, the central positions of the first to third memory structures 180a, 180b, and 180c are arranged along the linear line L, and the linear line L intersects the X direction and the Y direction on the XY plane. However, the linear line L may match with the Y direction, for example.

Further, in the first embodiment, the plurality of memory structures 180 are placed in a uniform pattern regardless of the layout of the conductive layer 140. However, the pattern in which the memory structures 180 are placed does not need to be uniform as long as the pattern is a pattern that enables high integration. In that case, the first to third memory structures 180a, 180b, and 180c only need to be in different positions in the Y direction, and do not necessarily need to be arranged along the linear line L.

Further, in the first embodiment, the outer peripheral surfaces of some of the memory structures 180 are opposed to the recessed portions formed in the side surface of the conductive layer 140 in the Y direction. However, the conductive layer 140 may cover the outer peripheral surfaces of all of the memory structures 180.

Further, in the first embodiment, as exemplified in FIG. 8 and the like, the conductive layer 140 is provided above the plurality of conductive layers 120. However, the conductive layer 140 only needs to be different from the plurality of conductive layers 120 in terms of the position in the Z direction (the abovementioned position in the first direction), and may be provided below the plurality of conductive layers 120, for example.

Figure 39:
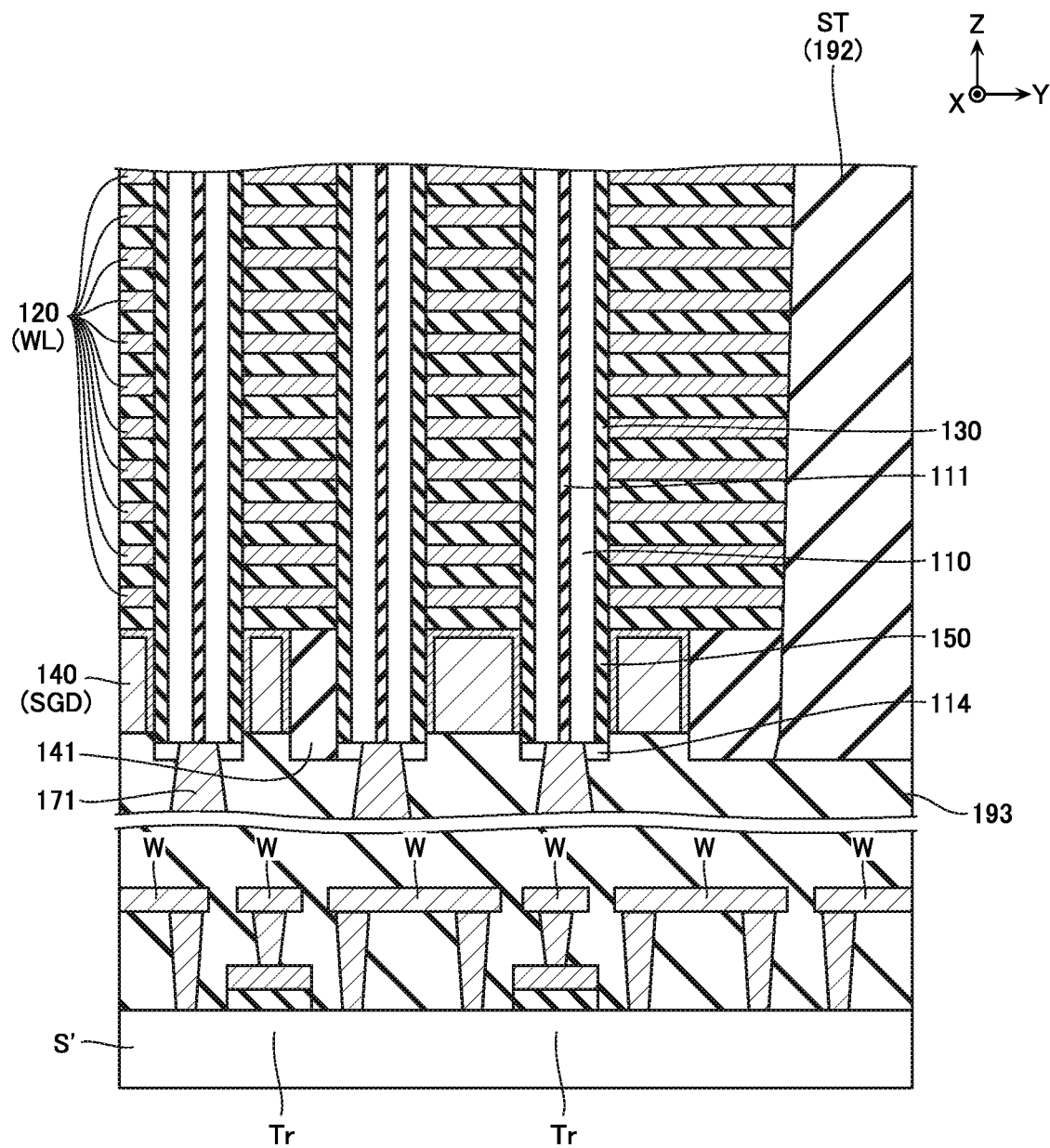
FIG. 39 is a schematic cross-sectional view of a memory cell array according to another embodiment.

For example, in the example in FIG. 39, when seen on basis of the substrate S', the conductive layer 140 is provided below the plurality of conductive layers 120. Further, a plurality of transistors Tr and wiring W that form the peripheral circuit PC (FIG. 1) are provided below the conductive layer 140.

Such a configuration is formed by, for example, forming a structure similar to the first embodiment on the substrate S according to the first embodiment, forming the plurality of transistors Tr and wiring W on the other substrate S', and bonding the structure on the substrate S and the structure on the substrate S' to each other.

Other than the above, the structure, the manufacturing method, and the like in the first embodiment can be changed, as appropriate.

[Other]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first conductive layer extending in a first direction;
a first insulating layer extending in the first direction, the first conductive layer and the first insulating layer being arranged in a second direction intersecting the first direction;
a first semiconductor layer opposed to the first conductive layer, and extending in a third direction intersecting the first direction and the second direction;
a second semiconductor layer opposed to the first conductive layer, extending in the third direction, and having a different position in the second direction from the first semiconductor layer;
a first contact electrode connected to the first semiconductor layer; and
a second contact electrode connected to the second semiconductor layer, wherein
in a first cross section extending in the first direction and the second direction:
an entire outer peripheral surface of the first semiconductor layer is surrounded by the first conductive layer; and
an outer peripheral surface of the second semiconductor layer is surrounded by the first conductive layer and the first insulating layer.

2. The semiconductor memory device according to claim 1 further comprising:
a second conductive layer extending in the first direction, the first insulating layer and the second conductive layer being arranged in the second direction;
a third semiconductor layer opposed to the second conductive layer, extending in the third direction, and having a different position in the second direction from the first semiconductor layer and the second semiconductor layer; and
a third contact electrode connected to the third semiconductor layer, wherein
in the first cross section:
an outer peripheral surface of the third semiconductor layer is surrounded by the second conductive layer and the first insulating layer.

3. The semiconductor memory device according to claim 2, wherein
in the first cross section, the first semiconductor layer, the second semiconductor layer, and the third semiconductor layer are arranged in a fourth direction intersecting the first direction.

4. The semiconductor memory device according to claim 2 further comprising:
a first gate insulating film provided between the first conductive layer and the first semiconductor layer, and contacting the first conductive layer and the outer peripheral surface of the first semiconductor layer;
a second gate insulating film provided between the first conductive layer and the second semiconductor layer and between the first insulating layer and the second semiconductor layer, and contacting the first insulating layer and the outer peripheral surface of the second semiconductor layer; and a third gate insulating film provided between the second conductive layer and the third semiconductor layer and between the first insulating layer and the third semiconductor layer, and contacting the first insulating layer and the outer peripheral surface of the third semiconductor layer.

5. The semiconductor memory device according to claim 2 further comprising
a third conductive layer having a different position in the third direction from the first conductive layer and the second conductive layer, and opposed to the outer peripheral surfaces of the first semiconductor layer, the second semiconductor layer, and the third semiconductor layer, wherein
in a second cross section extending in the first direction and the second direction, entire outer peripheral surfaces of the first semiconductor layer, the second semiconductor layer, and the third semiconductor layer are surrounded by the third conductive layer.

6. The semiconductor memory device according to claim 1, wherein:
the first conductive layer comprises:
a first portion opposed to the first semiconductor layer and to the second semiconductor layer; and
a second portion connected to a contact electrode; and
the second portion has a thickness in the third direction thinner than a thickness of the first portion in the third direction.

7. The semiconductor memory device according to claim 1 comprising:
a first memory cell and a first select transistor connected to the first memory cell and the first contact electrode; and
a second memory cell and a second select transistor connected to the second memory cell and the second contact electrode, wherein
the first select transistor comprises a part of the first semiconductor layer and a part of the first conductive layer, and
the second select transistor comprises a part of the second semiconductor layer and a part of the first conductive layer.

8. A semiconductor memory device comprising:
a first conductive layer extending in a first direction;
a second conductive layer having a different position from the first conductive layer in a second direction intersecting the first direction;
a first insulating layer extending in the first direction, the second conductive layer and the first insulating layer being arranged in a third direction intersecting the first direction and the second direction;
a first semiconductor layer opposed to the first conductive layer, the second conductive layer, and the first insulating layer, and extending in the second direction; and
a first contact electrode connected to the first semiconductor layer, wherein
in a first cross section extending in the first direction and the third direction, an entire outer peripheral surface of the first semiconductor layer is surrounded by the first conductive layer, and
in a second cross section extending in the first direction and the third direction, the outer peripheral surface of the first semiconductor layer is surrounded by the second conductive layer and the first insulating layer.

9. The semiconductor memory device according to claim 8 further comprising:
a third conductive layer extending in the first direction, the first insulating layer and the third conductive layer being arranged in the third direction;
a second semiconductor layer opposed to the first conductive layer, the third conductive layer, and the first insulating layer, and extending in the second direction; and
a second contact electrode connected to the second semiconductor layer, wherein
in the first cross section, an entire outer peripheral surface of the second semiconductor layer is surrounded by the first conductive layer, and
in the second cross section, the outer peripheral surface of the second semiconductor layer is surrounded by the third conductive layer and the first insulating layer.

10. The semiconductor memory device according to claim 8 comprising:
a first memory cell; and
a first select transistor connected to the first memory cell and the first contact electrode, wherein
the first memory cell comprises a part of the first semiconductor layer and a part of the first conductive layer, and
the first select transistor comprises a part of the first semiconductor layer and a part of the second conductive layer.

11. A semiconductor memory device comprising:
a first conductive layer extending in a first direction;
a second conductive layer extending in the first direction, the first conductive layer and the second conductive layer being arranged in a second direction intersecting the first direction;
a first insulating layer extending in the first direction, and provided between the first conductive layer and the second conductive layer;
a first semiconductor layer opposed to the first conductive layer and the first insulating layer, and extending in a third direction intersecting the first direction and the second direction;
a second semiconductor layer opposed to the second conductive layer and the first insulating layer, extending in the third direction, and having a different position in the second direction from the first semiconductor layer; and
a first gate insulating film provided between the first conductive layer and the first semiconductor layer and between the first insulating layer and the first semiconductor layer, and contacting the first insulating layer and an outer peripheral surface of the first semiconductor layer.

12. The semiconductor memory device according to claim 11 further comprising
a second gate insulating film provided between the second conductive layer and the second semiconductor layer and between the first insulating layer and the second semiconductor layer, and contacting the first insulating layer and an outer peripheral surface of the second semiconductor layer.

13. The semiconductor memory device according to claim 11 comprising:
a first memory cell and a first select transistor connected to the first memory cell;
a second memory cell and a second select transistor connected to the second memory cell, wherein the first select transistor comprises a part of the first semiconductor layer and a part of the first conductive layer, and the second select transistor comprises a part of the second semiconductor layer and a part of the second conductive layer.

14. A semiconductor memory device comprising:

a first conductive layer extending in a first direction;

a second conductive layer extending in the first direction, the first conductive layer and the second conductive layer being arranged in a second direction intersecting the first direction;

a first insulating layer extending in the first direction, and provided between the first conductive layer and the second conductive layer;

a first semiconductor layer opposed to the first conductive layer and the first insulating layer, and extending in a third direction intersecting the first direction and the second direction; and a second semiconductor layer opposed to the second conductive layer and the first insulating layer, and extending in the third direction, wherein in a first cross section extending in the first direction and the second direction, the first semiconductor layer and the second semiconductor layer are arranged in a fourth direction intersecting the first direction, and the first insulating layer comprises:

a first portion provided between the first semiconductor layer and the second semiconductor layer; and a second portion having a length in the fourth direction longer than a length in the fourth direction of the first portion.

15. The semiconductor memory device according to claim 14 further comprising a third semiconductor layer opposed to the first conductive layer, and extending in the third direction, wherein in the first cross section, an entire outer peripheral surface of the third semiconductor layer is surrounded by the first conductive layer.

16. The semiconductor memory device according to claim 14 further comprising:

a first gate insulating film provided between the first conductive layer and the first semiconductor layer and between the first insulating layer and the first semiconductor layer; and a second gate insulating film provided between the second conductive layer and the second semiconductor layer and between the first insulating layer and the second semiconductor layer.

17. The semiconductor memory device according to claim 14 further comprising:

a fourth semiconductor layer opposed to the first conductive layer and the first insulating layer, extending in the third direction, and adjacent to the first semiconductor layer in the first direction; and a fifth semiconductor layer opposed to the second conductive layer and the first insulating layer, extending in the third direction, and adjacent to the second semiconductor layer in the first direction, wherein in the first cross section:

the first insulating layer comprises a third portion provided between the fourth semiconductor layer and the fifth semiconductor layer, and having a length in the fourth direction shorter than the length in the fourth direction of the second portion; and the second portion of the first insulating layer is provided between the first portion of the first insulating layer and the third portion of the first insulating layer.

18. The semiconductor memory device according to claim 14, wherein in the first cross section, the first insulating layer comprises:

a plurality of the second portions arranged in the first direction; and a plurality of the first portions each placed between the plurality of second portions and having a length in the fourth direction that is shorter than a length in the fourth direction of the second portion.

19. The semiconductor memory device according to claim 14 comprising:

a first memory cell and a first select transistor connected to the first memory cell; and a second memory cell and a second select transistor connected to the second memory cell, wherein the first select transistor comprises a part of the first semiconductor layer and a part of the first conductive layer, and the second select transistor comprises a part of the second semiconductor layer and a part of the second conductive layer.

20. The semiconductor memory device according to claim 14, wherein in the first cross section, the fourth direction intersects the second direction.

* * * * *